United States Patent
Ikegami et al.

(10) Patent No.: US 9,705,053 B2
(45) Date of Patent: Jul. 11, 2017

(54) LIGHT EMITTING DEVICE AND METHOD OF MANUFACTURING LIGHT EMITTING DEVICE

(71) Applicant: NICHIA CORPORATION, Anan-shi, Tokushima (JP)

(72) Inventors: Takeshi Ikegami, Anan (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/747,640

(22) Filed: Jun. 23, 2015

(65) Prior Publication Data
US 2015/0295146 A1    Oct. 15, 2015

Related U.S. Application Data

(62) Division of application No. 14/537,947, filed on Nov. 11, 2014, now Pat. No. 9,093,620.

(30) Foreign Application Priority Data

Nov. 13, 2013    (JP) ................................ 2013-235279

(51) Int. Cl.
*H01L 33/00*    (2010.01)
*H01L 33/50*    (2010.01)
(Continued)

(52) U.S. Cl.
CPC .......... *H01L 33/507* (2013.01); *H01L 33/505* (2013.01); *H01L 33/54* (2013.01);
(Continued)

(58) Field of Classification Search
CPC ..... H01L 33/54; H01L 33/505; H01L 33/507; H01L 33/62; H01L 27/153;
(Continued)

(56) References Cited

U.S. PATENT DOCUMENTS 6,650,044 B1 * 11/2003 Lowery ................. H01L 33/505
313/498
7,759,145 B2    7/2010 Fujii
(Continued)

FOREIGN PATENT DOCUMENTS

JP    2002-324912 A    11/2002
JP    2005-005604 A    1/2005
(Continued)

*Primary Examiner* — Thinh T Nguyen
(74) *Attorney, Agent, or Firm* — Global IP Counselors, LLP

(57) ABSTRACT

A light emitting device includes at least one semiconductor light emitting element, and a wavelength conversion layer which is formed on a surface of the semiconductor light emitting element and which includes a resin layer containing a wavelength conversion member for converting a wavelength of light emitted from the semiconductor light emitting element. The wavelength conversion layer covers an upper surface or the upper surface and a side surface of the semiconductor light emitting element. A content of an inorganic material including the wavelength conversion member, or a content of an inorganic material including the wavelength conversion member and an inorganic filler, in the resin layer is 30% by mass or more and 99% by mass or less.

24 Claims, 8 Drawing Sheets

(51) Int. Cl.
*H01L 33/54* (2010.01)
*H01L 33/62* (2010.01)
*H01L 27/15* (2006.01)
*H01L 33/32* (2010.01)
*H01L 25/075* (2006.01)
*H01L 33/60* (2010.01)

(52) U.S. Cl.
CPC ........ *H01L 25/0753* (2013.01); *H01L 27/153* (2013.01); *H01L 33/32* (2013.01); *H01L 33/60* (2013.01); *H01L 33/62* (2013.01); *H01L 2224/16225* (2013.01); *H01L 2924/01078* (2013.01); *H01L 2933/0041* (2013.01)

(58) Field of Classification Search
CPC .......... H01L 2924/01078; H01L 33/32; H01L 2224/16225; H01L 25/0753; H01L 33/60; H01L 2923/0401
USPC ................ 257/98, 99, 100, 81, 82, E33.061, 257/E33.56; 438/22, 24, 46
See application file for complete search history.

(56) References Cited

U.S. PATENT DOCUMENTS

| | | | | |
|---|---|---|---|---|
| 2002/0185965 | A1* | 12/2002 | Collins, III | ........... H01L 33/505 313/501 |
| 2006/0118510 | A1 | 6/2006 | Fujii | |
| 2007/0096131 | A1* | 5/2007 | Chandra | ............... H01L 33/505 257/99 |
| 2009/0242917 | A1* | 10/2009 | Inoue | .................... H01L 33/504 257/98 |
| 2011/0031874 | A1* | 2/2011 | Hosokawa | ......... C09K 11/7734 313/503 |
| 2011/0116005 | A1* | 5/2011 | Sakai | .................. G02B 6/0023 349/61 |
| 2011/0297980 | A1 | 12/2011 | Sugizaki et al. | |
| 2012/0100695 | A1 | 4/2012 | Sugawara et al. | |
| 2012/0236582 | A1* | 9/2012 | Waragaya | ............ H01L 33/507 362/510 |
| 2013/0257264 | A1 | 10/2013 | Tamaki et al. | |
| 2014/0027804 | A1 | 1/2014 | Yoneda et al. | |
| 2014/0091334 | A1 | 4/2014 | Katayama et al. | |
| 2014/0091348 | A1 | 4/2014 | Katayama et al. | |
| 2015/0017750 | A1 | 1/2015 | Sugizaki et al. | |

FOREIGN PATENT DOCUMENTS

| | | |
|---|---|---|
| JP | 2005-116957 A | 4/2005 |
| JP | 2005-123560 A | 5/2005 |
| JP | 2005-327786 A | 11/2005 |
| JP | 2006-352036 A | 12/2006 |
| JP | 2007-067183 A | 3/2007 |
| JP | 2007-243076 A | 9/2007 |
| JP | 2008-258334 A | 10/2008 |
| JP | 2008-300580 A | 12/2008 |
| JP | 2011-253998 A | 12/2011 |
| JP | 2012-089721 A | 5/2012 |
| JP | 2012-164902 A | 8/2012 |
| JP | 2013-229438 A | 11/2013 |
| JP | 2014-027208 A | 2/2014 |
| JP | 2014-075450 A | 4/2014 |
| JP | 2014-090157 A | 5/2014 |

\* cited by examiner

LIGHT EMITTING DEVICE AND METHOD OF MANUFACTURING LIGHT EMITTING DEVICE

CROSS-REFERENCE TO RELATED APPLICATION

This application is a divisional application of U.S. patent application Ser. No. 14/537,947, filed on Nov. 11, 2014. This application claims priority to Japanese Patent Application No. 2013-235279, filed on Nov. 13, 2013. The entire disclosures of U.S. patent application Ser. No. 14/537,947 and Japanese Patent Application No. 2013-235279 are hereby incorporated herein by reference.

BACKGROUND OF THE INVENTION

1. Field of the Invention

The present disclosure relates to a light emitting device including a semiconductor light emitting element and a wavelength conversion layer, and a method of manufacturing the same.

2. Description of Related Art

There has been a white diode configured to emit white light by combining an LED (light emitting diode) to emit blue light and a wavelength conversion layer (phosphor layer) which absorbs a portion of the blue light emitted from the LED and converts the light to light of a different wavelength such as yellow light, are used in combination so that white light can be produced by mixing the blue light and the yellow light. In addition, as a method of manufacturing such a white diode, there has been a technique of applying a resin containing particles of a phosphor (wavelength conversion member) to an LED chip.

For example, JP 2012-119673 A discloses a technique in which a plurality of singulated LED chips are arranged spaced apart from each other on a carrier substrate with an adhesive agent applied on its upper surface, and a thermosetting resin containing a phosphor is applied onto an upper surface and side surfaces of each of the LED chips by screen printing using a stencil mask. In addition, JP 2012-119673 A discloses a technique in which the LED chips are arranged spaced apart from each other on the carrier substrate, then, the thermosetting resin containing a phosphor is applied to the upper surface of each LED chip and between the LED chips by using a spray device or the like, and after curing the resin, the LED chips are singulated into individual pieces by dicing.

Further, for example, JP 2003-69086 A discloses a technique in which phosphor particles are uniformly attached on the LED chip by electrodeposition. That is, according to the method disclosed in JP 2003-69086 A, a wavelength conversion layer is formed by electrophoretically attaching the phosphor particles to the surfaces of the LED chip.

SUMMARY OF THE INVENTION

According to a method of manufacturing a light emitting device in the embodiments of the present disclosure, the light emitting device includes a wavelength conversion layer which is formed on a surface of a semiconductor light emitting element and which includes a resin layer containing a wavelength conversion member for converting a wavelength of light emitted from the semiconductor light emitting element, and the method includes arranging at least two of the semiconductor light emitting elements spaced apart from each other on an expandable sheet having an adhesive surface, forming the resin layer containing the wavelength conversion member on the semiconductor light emitting element and the sheet, and disuniting the resin layer by expanding the sheet, in which the arranging, the forming, and the disuniting are performed in this order.

In addition, a light emitting device according to the embodiments of the present disclosure includes, on a surface of a semiconductor light emitting element, a wavelength conversion layer made of a resin layer containing a wavelength conversion member for converting a wavelength of light emitted from the semiconductor light emitting element. The wavelength conversion layer covers an upper surface or the upper surface and side surfaces of the semiconductor light emitting element. A content of an inorganic material including the wavelength conversion member or a content of an inorganic material including the wavelength conversion member and the inorganic filler in the resin layer excluding the solvent is 30% by mass or more and 99% by mass or less.

According to the method of manufacturing the light emitting device in the embodiments of the present invention, the resin layer formed on the surface of the semiconductor light emitting element can be disunited from the unnecessary resin layer and the light emitting elements are singulated into individual pieces only by expanding the sheet. Therefore, without the need to perform high-precision alignment for singulation, the wavelength conversion layer can be formed with stable dimensional precision, so that it is possible to manufacture the light emitting device capable of reducing the uneven distribution of light color. Furthermore, according to the light emitting device in the embodiments of the present invention, setting the content of the inorganic material in the wavelength conversion layer to the above range allows for obtaining of, the wavelength conversion layer which contains the sufficient amount of the phosphor and/or the inorganic filler to convert the wavelength and/or to diffuse the light, and in which bonding between the inorganic materials and bonding between the inorganic material and the semiconductor light emitting element can be obtained with sufficient strength by the resin.

BRIEF DESCRIPTION OF THE DRAWINGS

FIG. 2A shows an example in which a phosphor layer covers entire upper surface and entire side surfaces of a semiconductor light emitting element, FIG. 2B shows an example in which a phosphor layer covers entire upper surface and a part of the side surfaces of a semiconductor light emitting element. FIG. 2C shows an example in which a phosphor layer covers entire upper surface of the semiconductor light emitting element. FIGS. 2D, 2E, and 2G respectively show examples in which reflective resin layers cover the side surfaces and lower surfaces except for portions covered with the phosphor layers in the light emitting devices shown in FIGS. 2A, 2B, and 2C, FIG. 2F shows an example in which a reflective resin layer covers the side surfaces and a portion of a lower surface of a light emitting device, in which the phosphor layer covers the upper surfaces inclusive of the reflective resin layer, in the light emitting device.

FIGS. 3A and 3B are schematic views each showing a configuration of a light emitting device manufactured by a method of manufacturing a light emitting device according to an embodiment of the present invention, in which FIG. 3A shows a plan view, and FIG. 3B shows a cross-sectional view taken along line A-A in FIG. 3A.

FIGS. 5A to 5C are schematic cross-sectional views each showing a part of manufacturing steps in a method of manufacturing a light emitting device according to an embodiment of the present invention, in which FIG. 5A shows aligning the light emitting elements on an expandable sheet, FIG. 5B shows forming the resin layer by spraying, FIG. 5C shows pre-curing the resin layer.

FIGS. 6A to 6C are schematic cross-sectional views each showing a part of manufacturing steps in a method of manufacturing a light emitting device according to an embodiment of the present invention, in which FIG. 6A shows disuniting the resin layer by expanding an expandable sheet, FIG. 6B shows main curing the resin layer is finally cured, and FIG. 6C shows picking-up the light emitting device.

DETAILED DESCRIPTION OF EMBODIMENT

Figure 1:
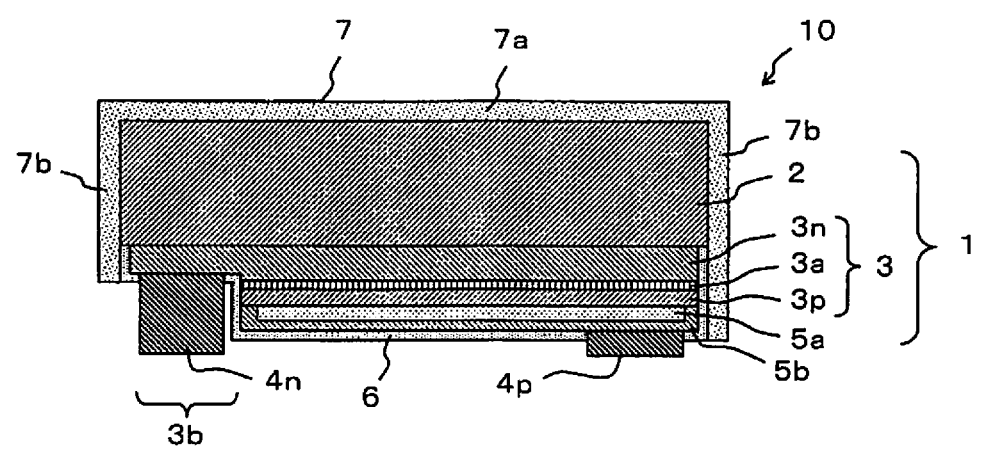
FIG. 1 is a schematic cross-sectional view showing a configuration of a light emitting device manufactured by a method of manufacturing a light emitting device according to an embodiment of the present invention.

Hereinafter, a method of manufacturing a light emitting device according to the embodiments of the present invention, and a light emitting device manufactured by this method will be described. In addition, the drawings referenced in the description below only schematically show the embodiments of the present invention, and dimensions, distances, and positional relationships of members may be exaggerated, or a portion of some members may be omitted in some cases. Furthermore, the dimensions and the distance of the members in a plan view and its corresponding cross-sectional view may not coincide. In the description below, the same designations or the same reference numerals denote the same or like members in general, and detailed descriptions will be appropriately omitted.

According to the method using the screen printing disclosed in JP 2012-119673 A, it is necessary to align the LED chips arranged on the carrier substrate with the stencil mask. If the LED chip is not accurately aligned with the stencil mask, the wavelength conversion layer is not formed in some region of the upper surface, and the wavelength conversion layer does not have a predetermined thickness on the side surface, uneven distribution of light color may result According to the latter technique, at the time of dicing the wavelength conversion layer applied between the LED chips, if the dicing position is not accurate, a predetermined thickness cannot be obtained on the side surface of the wavelength conversion layer, which may also resulting in uneven distribution of light color.

According to the method disclosed in JP 2003-69086 A, it is difficult to form the wavelength conversion layer on a single LED chip. If a supporting substrate having uniform in-plane electric resistance for the LED chip can be prepared, it is theoretically possible to form a resin layer containing phosphor particles and having a uniform thickness by the electrodeposition, but it is difficult to obtain the above supporting substrate. In addition, it is necessary to previously impart electrical conductivity to entire exposed surfaces of the LED chip to be used. Furthermore, according to the technique using the electrophoresis, a sheet needs to be soaked in an organic solvent for a long time, so that there are many restrictions in materials which can be used, and the method cannot be applied to various types of elements.

The present disclosure is made in view of the above problems, and an object of the present disclosure is to provide a light emitting device which has a wavelength conversion layer made of a resin layer containing a phosphor disposed on a surface of a semiconductor light emitting element and which can reduce unevenness in distribution light color, and a method of manufacturing the light emitting device.

Configuration of Light Emitting Device

A configuration of a light emitting device according to an embodiment of the present invention will be described with reference to FIG. 1. First, as shown in FIG. 1, a light emitting device 10 according to the present embodiment includes a semiconductor light emitting element 1 (hereinafter may be referred to as a "light emitting element"), and a phosphor layer (wavelength conversion layer) 7 which covers an upper surface and side surfaces of the light emitting element 1. Furthermore, the light emitting element 1 is an LED which includes a growth substrate 2, a semiconductor stacked layer 3, an n-side electrode 4n, a p-side electrode 4p, whole surface electrode 5a, a cover electrode 5b, and a protective layer 6.

Furthermore, the light emitting device 10 according to the present embodiment is a face-down mounting type light emitting device in which one surface of the light emitting element 1 serves as a mounting surface on which the semiconductor stacked layer 3, the n-side electrode 4n, and the p-side electrode 4p are disposed, and the surface at the growth substrate 2 side on which a phosphor layer 7 is disposed serves as the light extracting surface. In addition, the light emitting device 10 is configured to mix light (such as blue light) emitted from the light emitting element 1 with light (such as yellow light) from the phosphor layer 7 which partially converts a wavelength of the light emitted from the light emitting element 1, and outputs the mixed light from the upper surface and the side surface of the light emitting device 10.

The light emitting element 1 includes, on a lower surface side of the growth substrate 2, the semiconductor stacked layer 3 having an n-type semiconductor layer 3n and a p-type semiconductor layer 3p. The semiconductor stacked layer 3 is configures to emit light upon supplied with a current, and a light emitting layer 3a is preferably disposed between the n-type semiconductor layer 3n and the p-type semiconductor layer 3p.

The semiconductor stacked layer 3 has a region in which the p-type semiconductor layer 3p and the light emitting layer 3a do not exist in part, that is, a region recessed with respect to a surface of the p-type semiconductor layer 3p (this region may be referred to as a step-shape portion 3b) is formed. A bottom surface (lower surface in FIG. 1) of the step-shape portion 3b is an exposed surface of the n-type semiconductor layer 3n, and the n-side electrode 4n is formed in the step portion 3b. In addition, a whole surface electrode 5a having favorable reflectivity is disposed on approximately entire lower surface of the p-type semiconductor layer 3p and the cover electrode 5b is disposed to cover the whole surface electrode 5a. The p-side electrode 4p is disposed on a part of a lower surface of the cover electrode 5b. In addition, the surfaces of the semiconductor stacked layer 3 and the cover electrode 5b are covered with the protective layer 6 having insulating and light-transmissive properties, except for the n-side electrode 4n and the p-side electrode 4p which serve as the pad electrodes.

The growth substrate 2 is for epitaxially growing the semiconductor stacked layer 3. The growth substrate 2 only has to be formed of a substrate material capable of epitaxially growing the semiconductor stacked layer 3, and its size, thickness, and the like are not specifically limited. For example, in the case where the semiconductor stacked layer 3 is made of a nitride semiconductor such as GaN (gallium nitride), examples of the substrate material include an electrically insulating substrate such as sapphire having a principle plane of C-plane, R-plane, or A-plane, and spinel ($MgAl_2O_4$), silicon carbide (SiC), ZnS, ZnO, Si, GaAs, diamond, and oxide materials such as lithium niobate and neodymium gallate which form a lattice junction with a nitride semiconductor. In addition, the growth substrate 2 may be eventually removed by using a laser lift-off technique or a chemical lift-off technique, for example.

The semiconductor stacked layer 3 is a stacked layer as described above in which the n-type semiconductor layer 3n including the light emitting layer 3a, and the p-type semiconductor layer 3p are stacked. According to the present embodiment, the step-shape portion 3b is formed in such a manner that the p-type semiconductor layer 3p and the light emitting layer 3a and a portion of the n-type semiconductor layer 3n are removed from one part of the surface of the semiconductor stacked layer 3. Then, the n-side electrode 4n which is electrically connected to the n-type semiconductor layer 3n is formed on the bottom surface (lower surface) of the step-shape portion 3b. Furthermore, on a lower surface of the p-type semiconductor layer 3p which is a lower surface of the semiconductor stacked layer 3 except for the step-shape portion 3b, an electrode made of a stacked layer which is composed of the whole surface electrode 5a electrically connected to approximately entire lower surface of the p-type semiconductor layer 3p, the cover electrode 5b covering a lower surface and side surfaces of the whole surface electrode 5a, and the p-side electrode 4p disposed on a portion of the lower surface of the cover electrode 5b.

The semiconductor stacked layer 3 may be made of materials suitable for the semiconductor light emitting element, such as GaN, GaAs, InGaN, AlInGaP, GaP, SiC, and ZnO. According to the present embodiment, the light emitted from the light emitting element 1 is partially converted to light of a different wavelength in the phosphor layer 7, so that the semiconductor stacked layer 3 configured to emit blue light or purple light having a short emission wavelength can be suitably employed.

For the n-type semiconductor layer 3n, the light emitting layer 3a, and the p-type semiconductor layer 3p a GaN-based compound semiconductor such as $In_xAl_yGa_{1-X-Y}N$ ($0 \leq X$, $0 \leq Y$, $X+Y \leq 1$) can be suitably employed. In addition, each of the above semiconductor layers may have a single-layer structure, or have a stacked layer structure composed of layers each having a different composition and a different thickness, or a superlattice structure. Especially, the light emitting layer 3a preferably has a single quantum well or multiple quantum well structure in which thin layers each can produce a quantum effect are stacked.

In the case where the semiconductor stacked layer 3 is made of the GaN-based compound semiconductor, the semiconductor stacked layer 3 can be formed by a known technique such as MOCVD (metalorganic chemical vapor deposition) method, HVPE (hydride vapor phase epitaxy) method, or MBE (molecular beam epitaxy) method. The thickness of the semiconductor layer is not specifically limited, and various thickness can be applied.

The whole surface electrode 5a is disposed to cover approximately the entire lower surface of the p-type semiconductor layer 3p. The cover electrode 5b is disposed to cover the entire lower surface and the entire side surfaces of the whole surface electrode 5a. The whole surface electrode 5a serves as a conductor layer for uniformly diffusing a current supplied through the cover electrode 5b and the p-side electrode 4p disposed on the part of the lower surface of the cover electrode 5b, to the entire surface of the p-type semiconductor layer 3p. In addition, the whole surface electrode 5a also functions as a reflective film which has favorable reflectivity to reflect the light emitted from the light emitting element 1 upward, that is, toward the light extracting surface. Here, the term "favorable reflectivity" means that the light emitted from the light emitting element 1 can be preferably reflected. Furthermore, it is preferable that the whole surface electrode 5a has the favorable reflectivity also to the light of the wavelength converted by the phosphor layer 7.

The whole surface electrode 5a may be made of a metal material having preferable conductivity and reflectivity. As the metal material having the favorable reflectivity in a visible light region, Ag, Al, or an alloy containing the above metal as a main component may be preferably used. In addition, the whole surface electrode 5a may be made of a single layer or stacked layers of the above metal materials.

Furthermore, the cover electrode 5b serves as a barrier layer for preventing migration of the metal material constituting the whole surface electrode 5a. Especially in the case where the whole surface electrode 5a is made of Ag which is likely to cause the migration, the cover electrode 5b is preferably provided. The cover electrode 5b may be made of a metal material having favorable conductivity and barrier properties, such as Al, Ti, W, or Au. In addition, the cover electrode 5b may be composed of a single layer or stacked layers of the above metal materials.

The n-side electrode 4n is disposed on the bottom surface of the step-shape portion 3b of the semiconductor stacked layer 3 where the n-type semiconductor layer 3n is exposed. In addition, the p-side electrode 4p is disposed on a part of the lower surface of the cover electrode 5b. The n-side electrode 4n and the p-side electrode 4p serve as the pad electrodes for supplying external current to the light emitting element 1. The n-side electrode 4n is electrically connected to the n-type semiconductor layer 3n, and the p-side electrode 4p is electrically connected to the p-type semiconductor layer 3p through the cover electrode 5b and the whole surface electrode 5a.

The n-side electrode 4n and the p-side electrode 4p may be made of a metal material, and for example, a single metal such as Ag, Al, Ni, Rh, Au, Cu, Ti, Pt, Pd, Mo, Cr, or W, or an alloy of those can be suitably used. Furthermore, each of the n-side electrode 4n and the p-side electrode 4p may be made of a single layer or stacked layer of the above metal materials.

The protective layer 6 has insulating and light-transmissive properties and covers the entire surface of the light emitting element 1 except for the growth substrate 2 and portions of the n-side electrode 4n and the p-side electrode 4p to be connected to outside. The protective layer 6 functions as a protective film and an antistatic film of the light emitting element 1. In addition, since the protective layer 6 covers the side surfaces of the semiconductor stacked layer 3 from which the light is extracted, it is preferable that the protective layer 6 has favorable light-transmissive properties to the light of the wavelength emitted from the light emitting element 1. Furthermore, it is preferable that the protective layer 6 has favorable light-transmissive properties also to the light of the wavelength converted by the phosphor layer 7.

The protective layer 6 may be made of a metal oxide or metal nitride, such as an oxide or nitride of at least one selected from the group consisting of Si, Ti, Zr, Nb, Ta, and Al.

The phosphor layer (wavelength conversion layer) 7 is made of a resin layer containing phosphor particles (wavelength conversion member), and serves as a wavelength conversion layer which partially or entirely absorbs the light emitted from the light emitting element 1 and emits light of a wavelength different from the wavelength of the light emitted from the light emitting element 1. According to the example shown in FIG. 1, in the face-down mounted state, the phosphor layer 7 is provided to cover the entire upper surface (that is, the upper surface of the growth substrate 2) and the entire side surfaces (that is, the side surfaces of the growth substrate 2 and the side surfaces of the semiconductor stacked layer 3 with the protective layer 6) of the light emitting element 1.

The thickness of the phosphor layer 7 can be determined by the content of the phosphor and/or the color tone of the mixes color of the light emitted from the light emitting element 1 and the light of the converted wavelength. The thickness of the phosphor layer 7 is, for example, 1 µm to 500 µM, preferably 5 µm to 200 µm, and more preferably 10 µm to 100 µm.

A resin material preferably has favorable light-transmissive properties to the light emitted from the light emitting element 1 and the light of the wavelength converted by a phosphor contained in the phosphor layer 7. Furthermore, in the present embodiment, the resin material is preferably a thermosetting resin so that the phosphor layer 7 can be formed in such a manner that a slurry containing a solvent, the resin, and the phosphor particles is prepared and applied by spraying to form a resin layer, then the resin layer is cured by heating. As the above resin material, for example, a silicone resin, a modified silicone resin, an epoxy resin, a modified epoxy resin, a urea resin, a phenol resin, an acrylate resin, a urethane resin, a fluorine resin, a resin containing at least one kind of those resins, or a hybrid resin can be preferably used.

In addition, the phosphor (wavelength conversion member) is not specifically limited as long as the phosphor can be excited by light of the wavelength emitted from the light emitting element 1 and emits fluorescent light of the wavelength different from that of the exciting light, and the phosphor particles are preferably used. Since the phosphor particles has light diffusing and light reflecting properties, the phosphor functions as a light diffusion member in addition to the wavelength converting function, so that the phosphor has an effect of diffusing the light. It is preferable that the phosphor is roughly uniformly mixed in the phosphor layer 7 serving as the resin layer. In addition, as for the phosphor in the phosphor layer 7, two or more kinds may be uniformly mixed, or may be distributed to have a multilayer structure. Furthermore, the phosphor preferably has an average diameter of about 2.5 µm to about 30 µm measured by Fisher Sub Sieve Sizer (F. S. S. S.) method so that the slurry containing the solvent and the thermosetting resin with the phosphor can be sprayed.

As the phosphor material, a known material in the art can be used. Examples of the phosphor material include a YAG (yttrium aluminum garnet)-based phosphor activated by Ce (cerium), a LAG (lutetium aluminum garnet)-based phosphor activated by Ce, a nitrogen-containing calcium aluminosilicate ($CaO-Al_2O_3-SiO_2$)-based phosphor activated by Eu (europium) and/or Cr (chromium), a silicate ($(Sr, Ba)_2SiO_4$-based phosphor activated by Eu, a β sialon phosphor, and a KSF ($K_2SiF_6$:Mn)-based phosphor. In addition, a quantum dot phosphor may be also used.

In addition, a binding material to bond the phosphors is preferably added to the above phosphor material. As the binding material, for example, light-transmissive inorganic materials such as $SiO_2$, $Al_2O_3$, and MSiO (M is Zn, Ca, Mg, Ba, Sr, Zr, or Y) may be used.

Furthermore, in order to adjust the viscosity at the time of spraying or to give the light diffusing properties to the phosphor layer 7, an inorganic filler may be added. The inorganic filler is made of light-transmissive inorganic compound particles of oxide, carbonate, sulfate, or nitride of elements such as Si, Al, Zn, Ca, Mg, or rare earth element such as Y, or Zr or Ti, or composite salt such as bentonite or potassium titanate. The average particle diameter of the inorganic filler may be in a similar range as the above range of the average particle diameter of the phosphor.

In addition, in the phosphor layer 7 which is a resin layer, the content of an inorganic material including the phosphor particles and the inorganic filler particles, is preferably 30 to 99% by mass, more preferably 50 to 90% by mass, and still more preferably 60 to 85% by mass. When the content of the inorganic material is 30% by mass or more, more preferably 50% by mass or more, and sill more preferably 60% by mass or more, a sufficient amount of the phosphor and/or the inorganic filler can be provided to convert the wavelength and/or to diffuse the light. Furthermore, the light emitting elements are easily singulated into individual pieces by expanding an expandable sheet 20 (refer to FIGS. 5A to 5C) in a manufacturing method which will be described below. In addition, when the content of the inorganic material is 99% by mass or less, more preferably 90% by mass or less, and sill more preferably 85% by mass or less, the resin contained in the phosphor layer 7 can bond the inorganic materials to each other, and the inorganic material to the light emitting element 1 with enough strength.

Figure 2A:
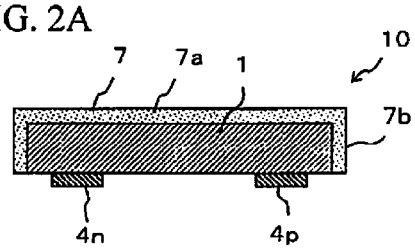
FIGS. 2A to 2G are schematic cross-sectional views each showing a configuration of a light emitting device manufactured by a method of manufacturing a light emitting device according to an embodiment of the present invention.

Furthermore, in the example shown in FIG. 1, the phosphor layer 7 is provided to cover the entire upper surface and the entire side surface of the light emitting element 1, but the present invention is not limited to this. Here, a configuration example of the phosphor layer 7 will be described with reference to FIGS. 2A to 2G. The light emitting device 10 in FIG. 2A shows a simplified structure of the light emitting element 1 in the example shown in FIG. 1, in which the phosphor layer 7 is provided to cover the entire upper surface (upper surface portion phosphor layer 7a), and the entire side surfaces (side surface portion phosphor layer 7b) of the light emitting element 1.

Figure 2D:
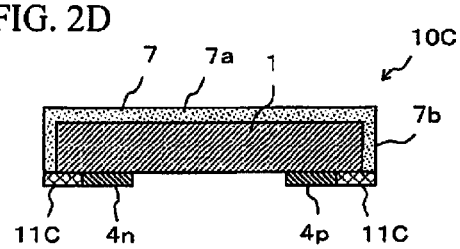
Figure 2B:
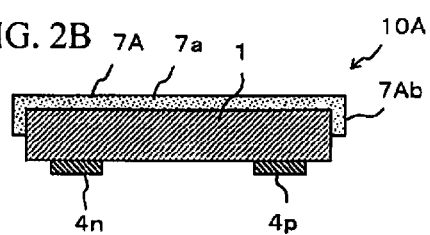

In the light emitting device 10A shown in FIG. 2B, a phosphor layer 7A is provided to cover the entire upper surface (upper surface portion phosphor layer 7a), and a part of the side surfaces (side surface portion phosphor layer 7Ab) of the light emitting element 1. More specifically, the side surface portion phosphor layer 7Ab provided on the side surfaces of the light emitting element 1 is formed as one layer such that its upper end is connected to the upper surface portion phosphor layer 7a on the upper surface of the light emitting element 1, and provided to cover the upper end partway down the lower end of the side surfaces of the light emitting element 1. That is, in the light emitting device 10A, a lower portion of the side surfaces of the light emitting element 1 is not covered with the phosphor layer 7A and exposed. Furthermore, in the light emitting device 10B shown in FIG. 2C, a phosphor layer 7B is provided to cover the entire upper surface (upper surface portion phosphor layer 7a) of the light emitting element 1, and not provided on the side surfaces of the light emitting element 1.

When the blue light is allowed to be leaked from the entire side surfaces or lower portion of the side surfaces of the light emitting element 1, the light emission efficiency can be improved as a whole in the light emitting devices 10A and 10B. In addition, as for the light emitting device 10, when the blue light is allowed to be leaked from a lower surface of the light emitting element 1 except for the portions of the n-side electrode 4n and the reflective whole surface electrode 5a, the light emission efficiency can be improved as a whole in the light emitting device 10.

On the other hand, when the blue light is allowed to be leaked from the side surface or the lower surface of the light emitting element 1, it is thought that light distribution chromaticity may be deteriorated in some cases. Thus, in order to improve the light distribution chromaticity, a reflective resin layer having light reflecting property may be formed on the side surfaces and/or the lower surface of the light emitting element 1 which are not covered with the phosphor layer 7.

FIGS. 2D to 2G show examples of light emitting devices each including the reflective resin layer. In the light emitting devices 10C, 10D, and 10F shown in FIGS. 2D, 2E, and 2G, respectively, reflective resin layers 11C, 11D, and 11F are provided to cover the lower surfaces and the side surfaces of the light emitting elements 1 except for portions covered with the phosphor layers 7, 7A, and 7B, with respect to the light emitting devices 10, 10A, and 10B shown in FIGS. 2A, 2B, and 2C, respectively. In addition, in the a light emitting device 10E shown in FIG. 2F, a reflective resin layer 11E (hereinafter, the reflective resin layers 11C, 11D, 11E, and 11F may be collectively referred to as the reflective resin layer 11) is provided to cover the lower surface and the side surfaces of the light emitting element 1, and a phosphor layer 7C is provided on the upper surface of the light emitting element 1 and an upper surface of the reflective resin layer 11E. When the reflective resin layer 11 is provided, the blue light emitted from the light emitting element 1 is securely extracted to outside through each of the phosphor layers 7, 7A, 7B, and 7C, so that the light distribution chromaticity can be improved.

Here, the reflective resin layer 11 has favorable reflectivity for the light of the wavelength emitted from the light emitting element 1 and the light of the wavelength emitted from the phosphor layer 7. The reflective resin layer 11 can be formed by applying a resin containing particles of alight reflection member, for example. In this case, as the resin material, materials having favorable light-transmissive properties for the light of the wavelength emitted from the light emitting element 1 and the wavelength of light emitted from the phosphor layer 7, such as silicone resin, epoxy resin, and urea resin may be used. As the light reflection member, for example, diffusing agents such as barium titanate, titanium oxide, aluminum oxide, silicon oxide, silicon dioxide, heavy calcium carbide, and light calcium carbide, or a mixture containing at least one of the above compounds may be used.

Figure 2E:
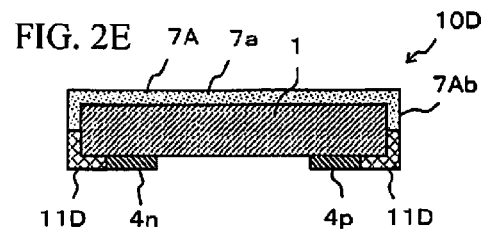
Figure 2C:
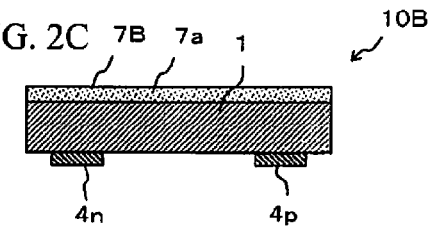
Figure 2F:
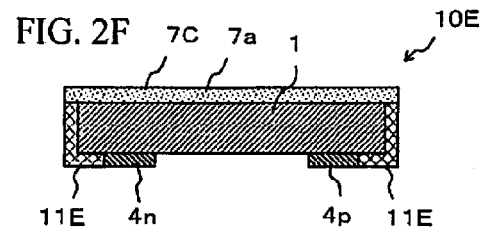
Figure 2G:
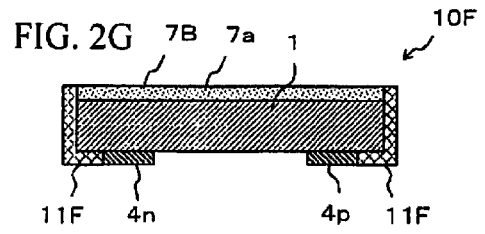
Figure 3A:
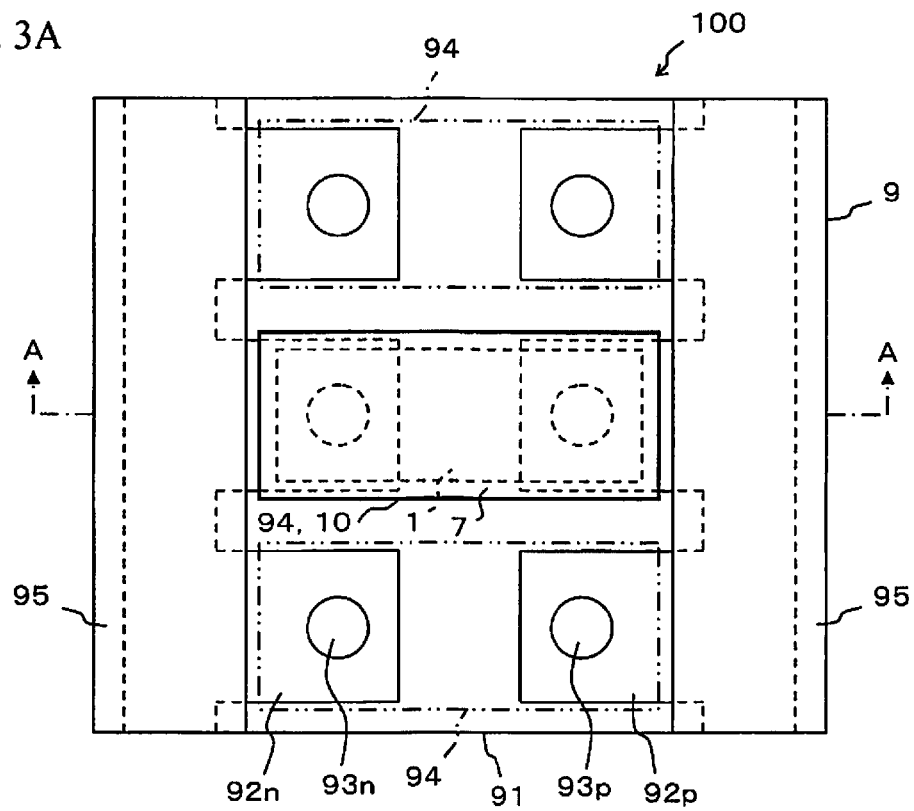
Figure 3B:
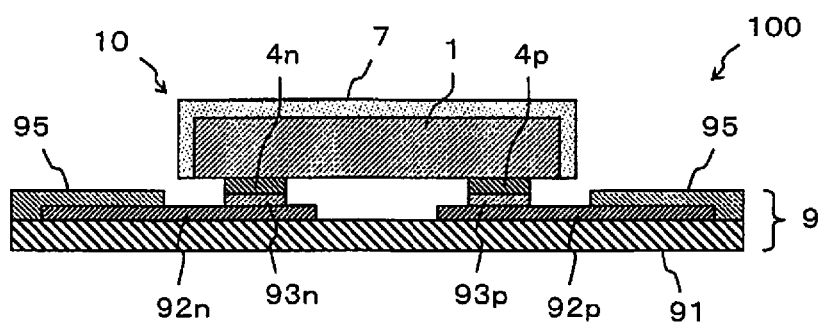

Next, a description will be given to a light emitting device with a mounting substrate in which the above light emitting devices 10 are mounted on the mounting substrate, with reference to FIGS. 3A and 3B. As shown in FIGS. 3A and 3B, a light emitting device 100 with the mounting substrate is provided by mounting the plurality of the light emitting devices 10 on a mounting substrate 9. The number of the light emitting devices 10 mounted on the mounting substrate 9 is not specifically limited, and at least one is to be mounted. Furthermore, the light emitting device to be mounted is not limited to the light emitting device 10 shown in FIG. 2A, and instead of the light emitting device 10, a light emitting device 10A shown in FIG. 2B, a light emitting device 10B shown in FIG. 2C, a light emitting device 10C shown in FIG. 2D, a light emitting device 10D shown in FIG. 2E, a light emitting device 10E shown in FIG. 2F, or a light emitting device 10F shown in FIG. 2G may be also used.

The example shown in FIG. 3A schematically and selectively shows a region in which the three light emitting devices 10 are mounted. In addition, the example shows a case where a light emitting device 10 is mounted in one mounting region 94 provided in a center among the three mounting regions 94.

As shown in FIG. 3A, the mounting substrate 9 is provided in such a manner that a negative side wiring electrode 92n and a positive side wiring electrode 92p each having a comb-like shape are provided on an insulating supporting substrate 91 so that their tooth portions in the comb-like shapes are opposed to each other in a planar view. The mounting region 94 for mounting the one light emitting device 10 includes one pair of tooth portions in the comb-like shapes of the negative side wiring electrode 92n and the positive side wiring electrode 92p.

Solder layers are disposed as a negative electrode connection layer 93n and a positive electrode connection layer 93p in each mounting region 94 at portions respectively connected to the n-side electrode 4n and the p-side electrode 4p of the light emitting device 10. The negative electrode connection layer 93n and the positive electrode connection layer 93p are melted by using a reflow technique or the like, and the n-side electrode 4n and the negative side wiring electrode 92n, and the p-side electrode 4p and the positive side wiring electrode 92p, are respectively connected. In addition, each of the negative side wiring electrode 92n and positive side wiring electrode 92p is connected to a feeding terminal, and supplied with a power from an external power supply through the respective feeding terminal.

In addition, right and left upper surface regions of the mounting substrate 9 except for the mounting region 94 are each covered with an insulating reflection layer 95. According to the example shown in FIGS. 3A and 3B, the reflection layer 95 only covers the right and left sides of the mounting region 94, but the reflection layer 95 may further cover a region except for the regions of the negative electrode connection layer 93n and the positive electrode connection layer 93p.

The reflection layer 95 has favorable reflectivity for the light of the wavelength emitted from the light emitting element 1 and the light of the wavelength emitted from the phosphor layer 7. The reflection layer 95 may be made of the same material as that of the above reflective resin layer 11, and can be formed by applying the resin containing the granular light reflection member.

In the light emitting device 100 with the mounting substrate in the embodiments of the present invention, the light emitting devices 10 may be sealed with a light-transmissive sealing member as a whole. The sealing member may be made of the resin material used for the phosphor layer 7 and the reflection layer 95, or an inorganic material such as glass or silica gel. Furthermore, a light diffusion member may be added to the sealing member. In this case, the light emitted from the light emitting element 1 can be favorably mixed with the light emitted from the phosphor layer 7. As the light diffusion member, the same member as that shown as the light reflection member of the reflection layer 95 may be used.

Furthermore, the light emitting device 10 in the embodiments of the present invention only needs to be configured such that the light of the wavelength emitted from the light emitting element 1 is converted at least partially by the phosphor layer 7 and outputted, so that the light is not limited to the combination of the blue light and the yellow light. For example, the light emitting element 1 may emit the blue light, and the phosphor layer 7 may convert the blue light to red light and/or green light, or the light emitting element 1 may emit ultraviolet light, and the phosphor layer 7 may convert the ultraviolet light to blue light, green light, yellow light, or red light having a longer wavelength.

Furthermore, the light emitting device 10 in the embodiments of the present invention is not limited to the face-down mounting type, and the light emitting device 10 may be a face-up mounting type or vertical mounting type. In the case of the face-up mounting type, the light emitting device 10 is configured as follows. First, the phosphor layer 7 is provided to cover the upper surface of the light emitting element 1 on which the semiconductor stacked layer 3 is provided. In addition, instead of the whole surface electrode 5*a* and the cover electrode 5*b* of the light emitting element 1, a whole surface electrode is formed of a conductive material having light-transmissive properties such as ITO (indium tin oxide), on the p-type semiconductor layer 3*p*, and a reflection layer is provided on a back surface of the growth substrate 2. Furthermore, openings are formed in the phosphor layer 7 to expose the surfaces of the n-side electrode 4*n* and the p-side electrode 4*p*. For example, the n-side electrode 4*n* and the p-side electrode 4*p* exposed in the openings are to be electrically connected with a wire to the negative side wiring electrode 92*n* and the positive side wiring electrode 92*p* of the mounting substrate 9, respectively.

In the case of the face-up mounting type or the vertical mounting type, a structure in which the electrode portion is exposed on the light extracting surface is formed as follows. First, a protective layer is formed of a soluble resist in the region to expose the electrode portion, and the phosphor layer 7 is formed thereon by spraying. After that, the soluble resist is washed with water, and the phosphor layer 7 formed on the soluble resist is also removed, so that the electrode portion can be exposed. Alternatively, after the phosphor layer 7 is formed on the region including the electrode portion by spraying, the electrode portion can be exposed by removing the phosphor layer 7 on the electrode portion by laser abrasion or the like.

Operation of Light Emitting Device

Next, an operation of the light emitting device 100 with the mounting substrate will be described with reference to FIGS. 3A and 3B (refer to FIG. 1 occasionally). The description will be given assuming that the light emitting element 1 emits blue light, and the phosphor layer 7 emits yellow light, for convenience of the description.

In the light emitting device 100 with the mounting substrate shown in FIGS. 3A and 3B, when the external power supply is connected to the feeding terminals provided in the mounting substrate 9, a current is supplied across the p-side electrode 4*p* and the n-side electrode 4*n* of the light emitting device 10 through the positive side wiring electrode 92*p* and the negative side wiring electrode 92*n*, respectively. When the current is supplied across the p-side electrode 4*p* and the n-side electrode 4*n*, the light emitting layer 3*a* of the light emitting element 1 emits blue light.

The blue light emitted from the light emitting layer 3*a* of the light emitting element 1 transmits in the semiconductor stacked layer 3 and the growth substrate 2. This light is outputted from the upper surface or the side surface of the light emitting element 1, and partially absorbed by the phosphor particles in the phosphor layer 7, converted to yellow light, and externally extracted. In addition, the blue light partially passes through the phosphor layer 7 without being absorbed by the phosphor, and externally extracted. The light transmitted downward in the light emitting element 1 is reflected upward by the whole surface electrode 5*a*, and outputted from the upper surface or the side surface of the light emitting element 1. Thus, the yellow light and the blue light are externally extracted from the light emitting device 10 and mixed with each other, and then white light is generated. The light extracted from the side surface of the light emitting device 10 in a downward direction is reflected upward by the reflection layer 95 and outputted from the light emitting device 100.

Next, a description will be given to a case where the light emitting device 100 with the mounting substrate is composed of the light emitting devices 10A shown in FIG. 2B, instead of the light emitting devices 10. As described above, according to the light emitting device 10A, the lower portion of the side surface of the light emitting element 1 is not covered with the phosphor layer 7A and exposed. Therefore, the blue light emitted from the light emitting layer 3*a* of the light emitting element 1 is partially outputted from the lower portion of the side surface of the light emitting element 1, and externally extracted from the light emitting device 10A as the blue light. The blue light extracted from the lower portion of the side surfaces of the light emitting element 1 is mixed with the yellow light and the blue light which are eternally extracted from other portions of the side surfaces and other surfaces, and outputted as the white light from the light emitting device 100 as a whole.

When the blue light emitted from the light emitting element 1 is made to be partially extracted from the lower portion of the side surface of the light emitting element 1 without passing through the phosphor layer 7A, a component of the blue light can be sufficiently obtained in the generated white light. In addition, the light emitting device 10A has favorable light extracting efficiency.

Next, a description will be given to a case where the light emitting device 100 with the mounting substrate is composed of the light emitting devices 10B shown in FIG. 2C, instead of the light emitting devices 10. As described above, according to the light emitting device 10B, the side surface of the light emitting element 1 is not covered with the phosphor layer 7B and exposed. Therefore, among the blue light emitted from the light emitting layer 3*a* of the light emitting element 1, the light transmitted in a lateral direction is outputted from the side surface of the light emitting element 1, and externally extracted from the light emitting device 10B as the blue light. The blue light extracted from the side surface of the light emitting element 1 is mixed with the yellow light and the blue light externally extracted from the upper surface, and the white light is outputted from the light emitting device 100 as a whole.

When the blue light emitted from the light emitting element 1 is made to be partially extracted from the side surface of the light emitting element 1 without passing through the phosphor layer 7B, a component of the blue light can be sufficiently obtained in the generated white light. In addition, the light emitting device 10B has favorable light extracting efficiency.

Next, a description will be given to a case where the light emitting device 100 with the mounting substrate is composed of the light emitting devices 10C shown in FIG. 2D, the light emitting devices 10D shown in FIG. 2E, the light emitting devices 10E shown in FIG. 2F, or the light emitting devices 10F shown in FIG. 2G, instead of the light emitting devices 10. As described above, according to each of the light emitting devices 10C, 10D, 10E, and 10F, the reflective resin layer 11 covers the portion not covered with the phosphor layer 7 in the side surface and the lower surface of the light emitting element 1. Therefore, the blue light leaked from each of the light emitting devices 10, 10A, and 10B is reflected by the reflective resin layer 11, and externally extracted through the phosphor layer 7. That is, the blue light emitted from the light emitting element 1 and externally extracted is all extracted through the phosphor layer 7. Therefore, the light emitting device 100 composed of the light emitting devices 10C, 10D, 10E, or 10F has favorable light distribution chromaticity.

Method of Manufacturing Light Emitting Device

Figure 4:
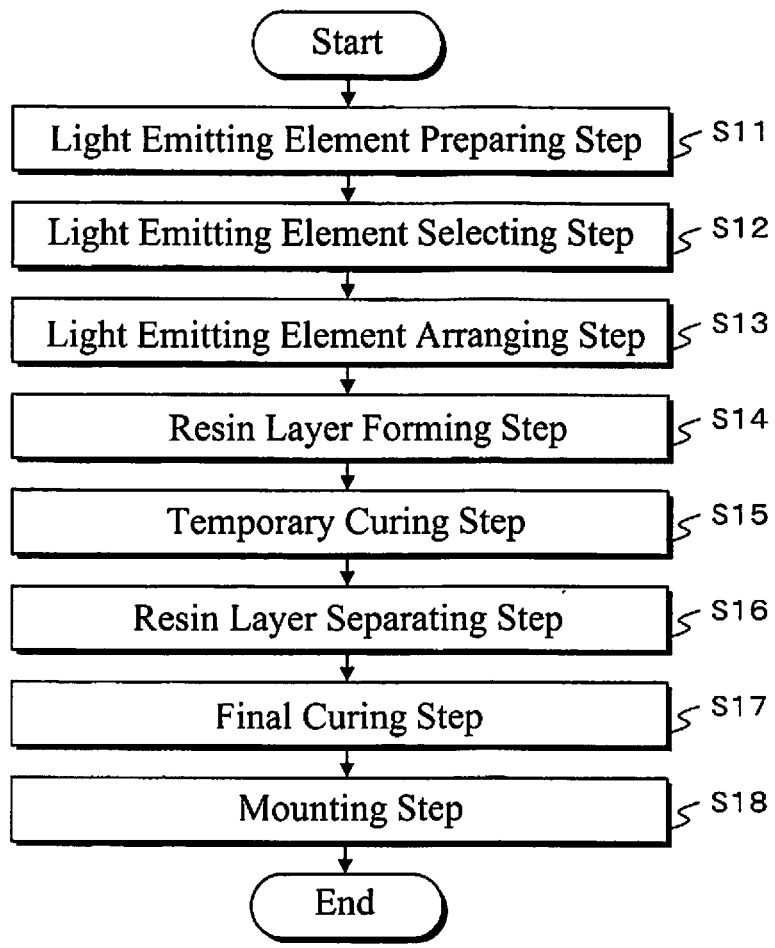
FIG. 4 is a flowchart showing a flow of the method of manufacturing the light emitting device according to an embodiment of the present invention.

Next, a method of manufacturing the light emitting device 100 shown in FIGS. 3A and 3B will be described with reference to FIG. 4. As shown in FIG. 4, the method of manufacturing the light emitting device 100 includes a light emitting element preparing step S11, a light emitting element selecting step S12, a light emitting element arranging step S13, a resin layer forming step S14, a temporary curing step S15, a resin layer disuniting step S16, a final curing step S17, and a mounting step S18, and those steps are performed in this order. Hereinafter, each step will be described in detail with reference to FIGS. 5A to 6C (refer to FIGS. 1, and 3A to 4, occasionally).

In the light emitting element preparing step S11, the singulated light emitting element 1 having the configuration shown in FIG. 1 is prepared. More specifically, the semiconductor stacked layer 3 is formed of the above-described semiconductor material by sequentially laminating the n-type semiconductor layer 3n, the light emitting layer 3a, and the p-type semiconductor layer 3p, on the growth substrate 2 (on the lower surface in FIG. 1) composed of sapphire or the like.

After the semiconductor stacked layer 3 has been formed, the step portion 3b in which the n-type semiconductor layer 3n is exposed in the bottom surface is formed by removing the p-type semiconductor layer 3p, the light emitting layer 3a, and one part of the n-type semiconductor layer 3n by etching from the one portion of the surface (lower surface in FIG. 1) of the semiconductor stacked layer 3. Then, the n-side electrode 4n serving as the pad electrode is formed on the bottom surface of the step portion 3b. In addition, the region serving as the light emitting region having the p-type semiconductor layer 3p and the light emitting layer 3a is covered with the reflective whole surface electrode 5a formed to cover approximately the entire lower surface of the p-type semiconductor layer 3p, the cover electrode 5b is formed to cover the surface of the whole surface electrode 5a, and the p-side electrode 4p serving as the pad electrode is formed in the one portion of the lower surface of the cover electrode 5b. Furthermore, the insulating $SiO_2$ protective layer 6 is formed on the entire surface of a wafer except for the n-side electrode 4n and the p-side electrode 4p, by sputtering, for example.

As a result, the light emitting elements 1 can be formed on the wafer. Subsequently, the light emitting elements 1 on the wafer are split by predetermined split regions by dicing method or scribing method, whereby the singulated light emitting element 1 can be made. In addition, before splitting the wafer, the back surface of the growth substrate 2 may be thinned by polishing. Thus, the wafer can be easily split.

Subsequently, in the light emitting element selecting step S12, light emitting elements 1 each having a predetermined range of light emission characteristics are selected among the light emitting elements 1 made in the light emitting element preparing step S11. Here, the predetermined range of light emission characteristics means a center wavelength and/or light emission intensity of the light emitted from the light emitting element 1. By selecting the light emitting element 1 having the similar light emission characteristics, the phosphor layer 7 can be highly uniformly formed in the resin layer forming step S14 which will be described below, and also the color tone can be prevented from being varied among the manufactured light emitting devices 10.

Figure 5A:
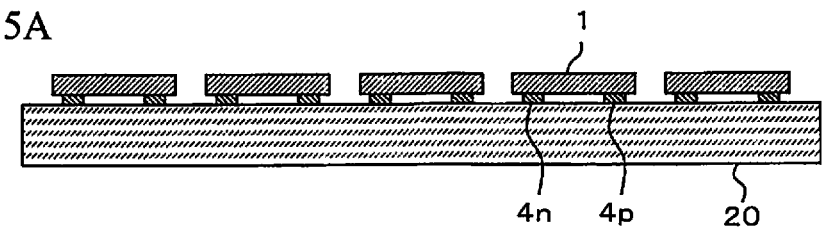

Subsequently, in the light emitting element arranging step S13, as shown in FIG. 5A, the light emitting elements 1 selected in the light emitting element selecting step S12 are arranged apart from each other with their side surfaces exposed, on an expandable sheet 20 which can be expanded and has an adhesive surface. At this time, the light emitting element 1 is arranged so that the surface having the n-side electrode 4n and the p-side electrode 4p is opposed to the expandable sheet 20. The expandable sheet may be a dicing sheet of a semiconductor wafer made of a resin such as vinyl chloride. For example, the dicing tape V-8-S manufactured by NITTO DENKO CORPORATION may be used.

As for the expandable sheet 20, a UV (ultraviolet)-curing type resin may be formed as an adhesive agent on the surface on which the light emitting element 1 is set. In the mounting step S18 which will be described below, the adhesive resin is cured by irradiating the expandable sheet 20 with UV light so that the adhesiveness can disappear. In this way, with a collet 50 and a pin 51 (refer to FIG. 6C), for example, the light emitting element 1 provided with the phosphor layer 7, that is, the light emitting device 10 can be easily removed from the expandable sheet 20.

Figure 5B:
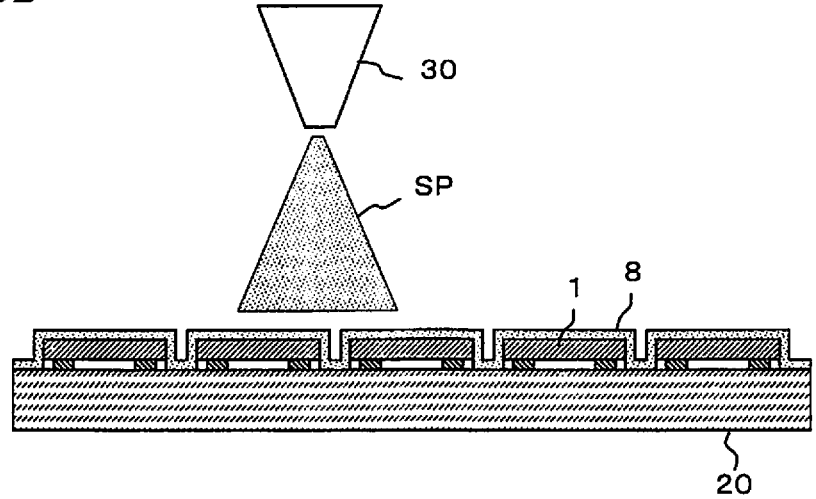

Subsequently, in the resin layer forming step S14, as shown in FIG. 5B, a resin layer 8 is formed by injecting spray SP of a slurry as a raw material of the phosphor layer 7 from a spray device 30 onto the expandable sheet 20 on which the light emitting elements 1 are arranged. Here, the light emitting elements 1 may be arranged in a one dimensional manner or two dimensional manner. In each case, the light emitting elements 1 are arranged apart from each other with the side surfaces of the light emitting elements 1 exposed. In addition, the expandable sheet 20 is set on a stage, and this stage and the spray device 30 are configured to be relatively moved in at least a horizontal direction. Thus, by the spraying process, the resin layer 8 having a predetermined thickness is uniformly and continuously formed on the upper surface and the side surface of the light emitting elements 1 and on the expandable sheet 20.

The spray device 30 is not specifically limited, but the spray device 30 preferably employs a pulsed spray method in which the spray SP is injected in a pulsed way, that is, intermittently. The intermittent spraying can reduce an injection amount per unit time. Therefore, the spray device 30 sprays a small amount of slurry while being moved at low speed, so that the slurry can be uniformly applied to the side surface and a corner portion of the uneven spray surface. In addition, the pulsed spray method can reduce an air velocity without reducing a spray velocity of the slurry from a nozzle, compared with a continuous spray method. Therefore, when the pulsed spray method is used, the slurry can be preferably supplied to the surface similarly to the continuous spray method, and in addition, the applied slurry is not disturbed by an air flow. As a result, the coating film can have a high adhesiveness between the particles of the phosphor and the surface of the light emitting element 1.

Since the pulsed spray method can reduce the spray amount, a thin film can be formed by reducing the spray amount applied each time of the spraying process. Thus, by repeating the spraying process for multiple times, the thickness of the resin layer 8 as the sprayed film can be formed with high precision. When a temporary curing process is performed for the thermosetting resin with respect to each time or several times (three times, for example) of the spraying processes, the uniform resin layer 8 having the high-precision thickness can be formed without causing dripping on the side surface portion. The pulsed spray method and the temporary curing process will be described in detail below.

Furthermore, the slurry to be applied by the spray device 30 contains a solvent, a thermosetting resin, and phosphor particles. An inorganic filler may be further added to the slurry. In addition, the slurry can be sprayed and adjusted to have appropriate viscosity so that a slurry applied on the side surface portion of the light emitting element 1 does not drip.

The thermosetting resin is not specifically limited as long as it has favorable light-transmissive properties for the wavelength of light emitted from the light emitting element 1 and the wavelength of light emitted from the phosphor contained in the phosphor layer 7, and the above silicone resin, epoxy resin, and urea resin can be used. Specifically, an example of the thermosetting resin includes a silicone resin manufactured by Shin-Etsu Chemical Co., Ltd. (product name: LPS-3541). Furthermore, as the solvent, organic solvents such as n-hexane, n-heptane, toluene, acetone, and isopropanol may be used.

In addition, it is preferable that the thermosetting resin which is in a solid state at room temperature is dissolved in a solvent when used. This makes it possible to cure the resin layer 8 formed of applied slurry to have appropriate hardness by the temporary curing process.

Here, the temporarily curing means that the solvent contained in the resin layer 8 is evaporated and the resin layer 8 is incompletely cured by heating for a predetermined time at a predetermined temperature lower than the curing temperature at which the thermosetting resin completely causes a cross-linking reaction. That is, the amount of the solvent evaporated can be controlled by controlling the heating temperature and the heating time in the temporary curing process, and as a result, the hardness of the resin layer 8 can be adjusted. Furthermore, final curing means that the thermosetting resin is cured due to cross-linking reaction by heating for a predetermined time at a predetermined temperature equal to or higher than the temperature (curing temperature) at which the thermosetting resin causes cross-linking reaction. In addition, during the final curing processing, the solvent contained in the resin layer 8 is approximately completely evaporated.

A prescription example of the slurry is shown below.
Thermosetting resin: silicone resin (LPS3541)
Solvent: n-heptane
Phosphor:thermosetting resin:solvent (mass ratio)=15:10:15
Furthermore, the constituents of the slurry is preferably adjusted so that the slurry has a viscosity of 0.01 to 1000 mPa·s (mm Pascal/sec), and more preferably 0.1 to 100 mPa·s. When the slurry has the viscosity within this range, the slurry can be uniformly sprayed and excessive dripping can be prevented after sprayed.

According to the pulsed spray method, the slurry containing the phosphor, the resin, and the solvent and having a low phosphor concentration is applied to a workpiece (spray target body) with a two-fluid nozzle capable of simultaneously spraying gas and liquid, while respectively being turned ON/OFF in a pulsed way. The workpiece is previously warmed up so that the solvent is instantaneously evaporated on a surface of the workpiece and a resin film containing an extremely small amount of phosphor can be formed. That is, the spraying process and the temporary curing process can be substantially performed at the same time. By repeating the above processes, the resin layer 8 can be formed to have the stacked thin resin layers each containing the phosphor.

With the use of the pulsed spray technique, the resin layer 8 can be formed with optimal characteristic for the singulation performed by expanding the expandable sheet 20. That is, the resin layer 8 can be formed to have high ratio of phosphor in the mixture of the phosphor and the resin, and have a thin total thickness.

Here, phosphor ratio=(phosphor mass)/(phosphor mass+resin mass) is preferably 30 to 99% by mass, more preferably 50 to 90% by mass, and still preferably 60 to 85% by mass. When the content of the phosphor to the resin is increased so that the phosphor ratio is preferably 30% by mass or more, more preferably 50% by mass or more, and still more preferably 60% by mass or more, the resin layer 8 is likely to be cracked when the expandable sheet 20 is expanded, so that the resin layer 8 can be easily torn off at the lower portion of the side surface of the light emitting element 1. In addition, when the ratio of the phosphor in the resin is 99% by mass or less, more preferably 90% by mass or less, and sill more preferably 85% by mass or less, phosphor particles can be bonded to each other, and the resin layer 8 and the light emitting element 1 can be bonded to each other with enough strength.

Furthermore, in addition to the phosphor, a filler made of inorganic material may be added, and as the solid content of the inorganic material particles composed of the phosphor and the filler is increased, the resin layer 8 can be more easily torn off when the expandable sheet 20 is expanded. In this case, inorganic material ratio=(phosphor mass+inorganic filler mass)/(phosphor mass+inorganic filler mass+resin mass) is preferably 30 to 99% by mass, more preferably 50 to 90% by mass, and still more preferably 60 to 85% by mass.

In the case where the resin layer 8 is formed by stacking a plurality of thin films, each thin film of the stacked layer may have a different inorganic material ratio. At this time, it is preferable that at least one layer among the plurality of thin films in the resin layer 8 has the above inorganic material ratio. In this case, this one layer preferably has an inorganic material ratio of 50% by mass or more. Thus, even in a case where another thin film has a low inorganic material ratio, crack is generated from this one thin film layer as a start point, so that when the expandable sheet 20 is expanded, the resin layer 8 can be easily torn off.

In the case where the resin layer 8 is formed by laminating the plurality of thin films, each thin film is preferably formed in such a manner that the inorganic material (phosphor and the inorganic filler) is settled down at a lower portion. That is, the resin layer 8 is preferably formed into a configuration in which inorganic material rich layers each having the high inorganic material ratio, and clear layers having the low inorganic material ratio are alternately stacked. With this configuration, the portion having the microscopically high inorganic material ratio is formed, and when the expandable sheet 20 is expanded, the crack is likely to be generated in the portion having the high inorganic material ratio. Therefore, the resin layer 8 can be more easily cut. This configuration can be formed in such a manner that each time when the slurry is sprayed to form the thin film, a solvent ratio and the temporarily curing temperature of the slurry are to be adjusted in view of a time taken for the inorganic material in the slurry to be settled down to the lower portion of the thin film.

Furthermore, the total film thickness of the applied resin layer 8 (thickest portion) is preferably 1 to 500 µm, more preferably 5 to 200 µm, and still more preferably 10 to 100 µm. Thus, when the film thickness of the resin layer 8 is small, the resin layer 8 can be easily torn off due to the expansion of the expandable sheet 20. Furthermore, the film thickness of the resin layer 8 at a part to be torn off (a disunion part of the resin layer 8 at the lower end portion of the side surface of the light emitting element 1) is preferably 200 µm or less, and the film thickness is preferably smaller than the resin layer 8 formed on the surface of the light emitting element 1. Thus, the cutting position can be specified, and the cutting can be performed with high positional precision. Furthermore, the content of the phosphor in the stacked resin layer 8 is preferably adjusted to 0.1 to 50 mg/cm$^2$ in mass per unit area. When the content of the phosphor is set within this range, the color conversion can be sufficiently implemented.

Another advantage in the pulsed spray method is that a three-dimensional structure of the resin layer 8 can be controlled by controlling the curing condition of the resin. When the three-dimensional structure can be controlled, it is possible to control the removal of the resin layer 8 from the light emitting element 1 and the cutting position of the resin layer 8 due to the expansion of the expandable sheet 20.

In addition, at the time of spraying, by controlling the spray amount with respect to each spray region with a mask having an appropriately shaped opening, a more fine three-dimensional structure can be formed. For example, when the slurry is sprayed with a mask which covers the expandable sheet 20 in the vicinity of an outer edge portion (boundary) of the light emitting element 1, the film thickness of the resin layer 8 formed on the expandable sheet 20 in the vicinity of the outer edge portion of the light emitting element 1 can be smaller than that of the resin layer 8 formed on the upper surface and the side surface of the light emitting element 1.

Figure 7:
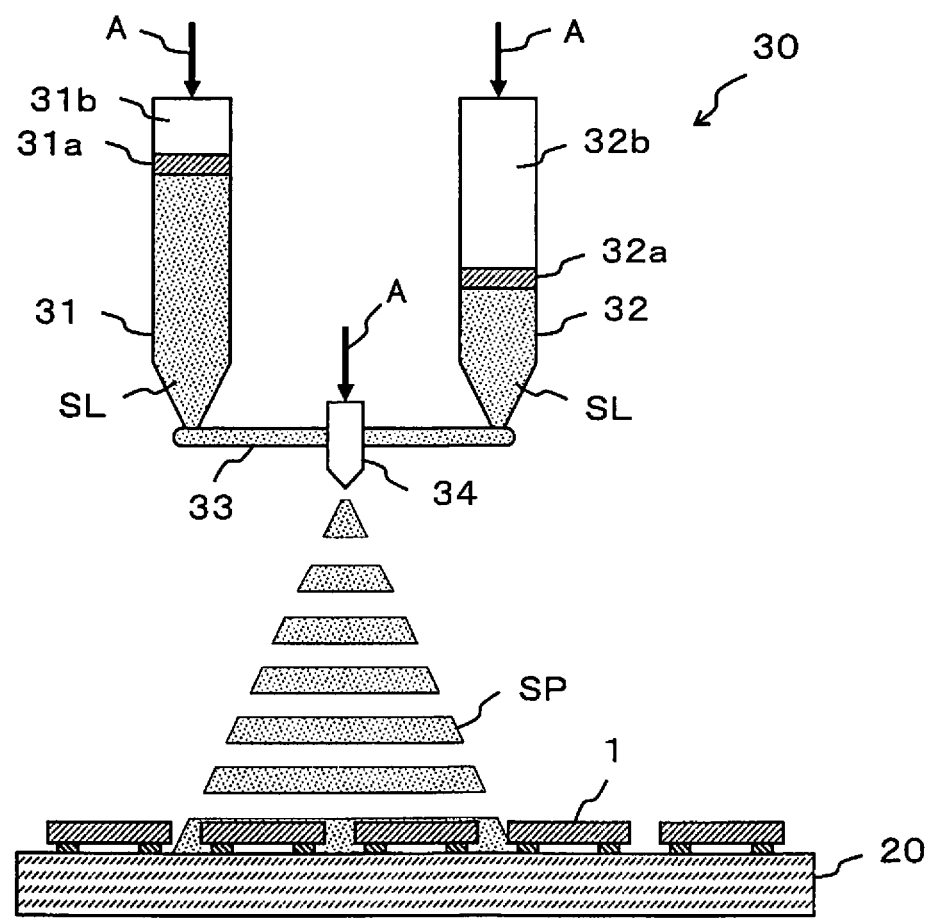
FIG. 7 is a schematic cross-sectional view showing disposing a resin layer containing phosphor particles by spraying in a method of manufacturing a light emitting device according to an embodiment of the present invention.

Here, an example of the spray device 30 will be described with reference to FIG. 7. The spray device 30 shown in FIG. 7 is suitable for spraying a slurry as a spray solution containing solid particles. That is, the spray device 30 is configured to constantly stir the slurry as the spray solution so that the solid particles are evenly diffused all the time without being settled down, and the slurry having evenly diffused solid particles can be sprayed. Thus, the spray device 30 shown in FIG. 7 includes two syringes 31 and 32, a circulation path 33 for connecting lower ends of the syringes 31 and 32, and a valve 34 with a nozzle provided in the middle of the circulation path 33.

The syringe 31 is a cylindrical container internally including a plunger 31a and containing slurry SL. A lower end of the syringe 31 is narrowed, and the lower end communicates with the circulation path 33. Furthermore, a compressed air 31b is internally introduced from an upper end of the syringe 31 through a valve. Thus, the slurry SL in the syringe 31 is pressed by the introduced compressed air 31b through the plunger 31a.

The syringe 32 has the same configuration as that of the syringe 31 and internally contains slurry SL, and its narrowed lower end communicates with the circulation path 33. Therefore, the syringe 31 and the syringe 32 communicate with each other through the circulation path 33, so that the slurry SL internally contained in the syringes can be mixed with each other. Similar to the syringe 31, a compressed air 32b is internally introduced from an upper end of the syringe 32 through a valve. Thus, the slurry SL in the syringe 32 is pressed by the introduced compressed air 32b through the plunger 32a.

The valve 34 with the nozzle is provided in the middle of the circulation path 33, and configured to inject the slurry SL in the circulation path 33 from the nozzle having a downward opening. Furthermore, the valve 34 with the nozzle is configured to receive compressed air from outside and inject the compressed air from the nozzle so that the slurry SL can be injected as the spray SR Furthermore, the valve 34 with the nozzle is configured to be able to control the slurry amount and the compressed air amount to be injected from the nozzle by adjusting opening degrees of the corresponding valves.

Next, a description will be given to an operation for stirring the slurry SL in the spray device 30. The compressed air is supplied from a different compressed air source to the upper end of each of the syringes 31 and 32. The compressed air is supplied such that a pressure of the compressed air 31b introduced to the syringe 31, and a pressure of the compressed air 32b introduced to the syringe 32 are pulsated in different phases (opposite phases, for example). The spray device 30 can move the slurry SL back and forth between the syringes 31 and 32 through the circulation path 33, and as a result, the slurry SL can be stirred.

The slurry SL is constantly stirred, so that the slurry SL having the uniformly diffused phosphor serving as the solid particles is circulated in the circulation path 33 all the time. When the slurry SL circulated in the circulation path 33 is injected by the valve 34 with the nozzle, the spray SP evenly containing the phosphor particles can be injected.

Next, a description will be given to the spraying process by the pulsed spray method with the spray device 30. As described above, by the pulsed spray method, the spray SP is injected in the pulsed way, that is, intermittently. By adjusting the valve opening degree of the valve 34 with the nozzle in the spray device 30, the injected amount of the spray SP can be controlled. As a simple method, the opening degree of the valve is set at two stages such as "open" and "closed", and the opening and closing are controlled at a predetermined cycle and a duty ratio, so that the pulsed spraying process can be performed. The opening and closing timing of the valves may be set so that the slurry SL and the compressed air are supplied at the same time, or the opening timing of the valve for the compressed air may be set longer. Furthermore, in order to keep the injected amount of the spray SP per unit time with high precision, a cycle of the opening and closing of the valve is preferably set at 30 times to 3600 times per minute.

The pulsed spray method and the spray device suitable for spraying the slurry are described in detail in Reference document 1 and Reference document 2, so that a further description is omitted.

(Reference document 1) JP 61-161175 A
(Reference document 2) JP 2003-300000 A

Figure 5C:
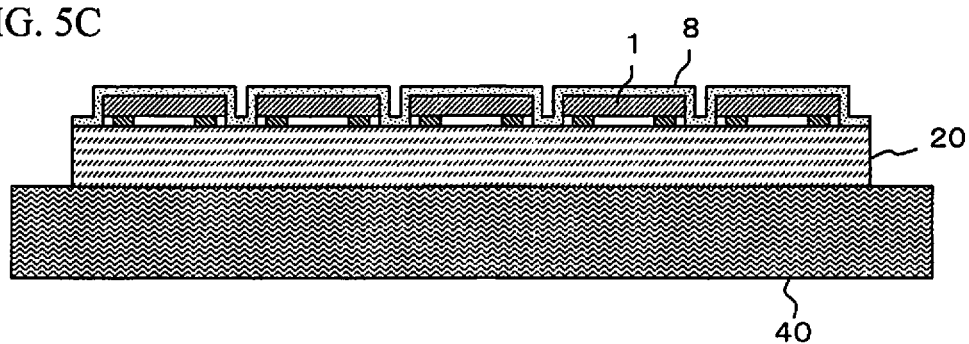

Referring to FIGS. 5A to 5C again (refer to FIGS. 1, 3A to 4 occasionally), the manufacturing step will be described again. In the temporary curing step S15, as shown in FIG. 5C, the resin layer 8 formed in the resin layer forming step S14 is temporarily cured by a heating device 40. As a result, the resin layer 8 changes its state from a mucous state to a state having appropriate hardness and tensile strength. A heating method of the heating device 40 is not specifically limited, and as shown in FIG. 5C, a heater having a contact with a lower surface of the expandable sheet 20 may be used, or infrared light may be applied, that is, a heater or an oven may be used in an appropriate manner.

According to the embodiments of the present invention, by adjusting a heating time and/or a heating temperature by the heating device 40 depending on the kind and the content amount of the thermosetting resin, the degree of the temporary curing can be adjusted. As described above, in the case where the spraying process is performed several times, the resin layer forming step S14 and the temporary curing step S15 may be alternately performed several times. In this case, the number of the spraying process and the number of the temporary curing process may not be the same, and the temporary curing process may be performed once after the spraying process is performed three times. In this way, when the temporary curing process is performed appropriately among the plurality of spraying processes, the resin layer 8 can be uniformly and thickly formed while preventing the applied slurry from dropping onto the side surface of the light emitting element 1 especially.

Instead of the temporary curing step S15 in which the aggressive heating process is performed with the heating device 40 after the spraying process, a curing process may be naturally performed at room temperature before the resin layer disuniting step S16 as the next step.

In the case of the slurry provided in the above-described example, the temporary curing process can be performed under the following condition, for example.

(Resin Layer Forming Step)

As the resin layer 8, three layers can be stacked with the spray amount of about 0.7 mg/cm$^2$ for each layer.

(Temporary Curing Step)

As the temporary curing process, a heating process can be performed for 5 minutes at 150° C. in an oven after the three layers are stacked.

Figure 6A:
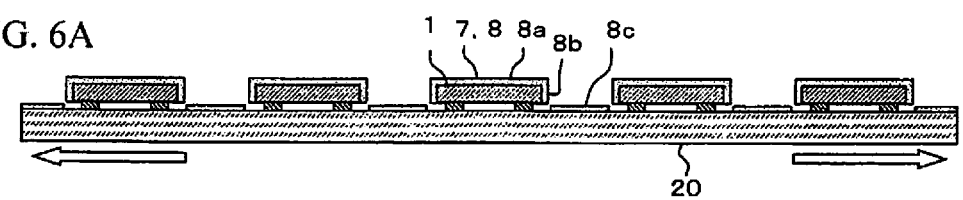

Subsequently, in the resin layer disuniting step S16, as shown in FIG. 6A, the expandable sheet 20 is expanded. The expandable sheet 20 can be expanded in such a manner that both ends of the expandable sheet 20 with respect to an expanding direction are gripped by appropriate jigs and the jigs are moved apart from each other in the expanding direction. Here, in the case where the light emitting elements 1 are arranged in the one dimensional manner, the expandable sheet 20 is expanded in the arrangement direction. In the case where the light emitting elements 1 are arranged in two dimensional manner, the expandable sheet 20 may be expanded in the two arrangement directions at the same time, or may be sequentially expanded in one direction and then another.

When the expandable sheet 20 is expanded in the arrangement direction of the light emitting elements 1, that is, when the expandable sheet 20 is expanded in a lateral direction which is a sheet in-plane direction, an upper surface portion resin layer 8a, which is the resin layer 8 formed on the upper surface of the light emitting element 1, and a side surface portion resin layer 8b, which is the resin layer 8 formed on the side surface of the light emitting element 1, are disunited from a sheet portion resin layer 8c, which is the resin layer 8 formed on the expandable sheet 20. Thus, the upper surface portion resin layer 8a and the side surface portion resin layer 8b left on the surface of the light emitting element 1 become the phosphor layer 7 (refer to FIG. 1).

After the resin layer 8 is disunited by expanding the expandable sheet 20, the phosphor layer 7 as the resin layer 8 formed on the upper surface, or the upper surface and the side surface, of the light emitting element 1 may be covered with a thin light-transmissive resin layer as a protective film. Since the light-transmissive resin layer is provided, the light extracting properties can be improved. This light-transmissive resin layer can be formed in such a manner that a solution not containing the phosphor and the inorganic filler but containing the thermosetting resin used for forming the resin layer 8 is sprayed by the pulsed spray method, and then cured by heat.

When the light-transmissive resin layer is formed after the resin layer 8 serving as the phosphor layer 7 is disunited, a load at the time of disuniting (cutting) the resin layer 8 is not increased. The light-transmissive resin layer is formed to be sufficiently thin compared with the phosphor layer 7, so that even when the light-transmissive resin layer is continuously formed from the phosphor layer 7 onto the expandable sheet 20, the light-transmissive resin layer on the phosphor layer 7 can be easily disunited from the light-transmissive resin layer on the expandable sheet 20 by further expanding the expandable sheet 20, or by a pickup in the mounting step S18 which will be described below.

In the resin layer disuniting step S16, the expandable sheet 20 may be expanded in a vertical direction (direction perpendicular to the sheet surface) without being expanded in the lateral direction or in addition to being expanded in the lateral direction. A relationship between the expanding direction of the expandable sheet 20 and the disunion of the resin layer 8 will be described below.

According to the embodiments of the present invention, the light emitting element 1 provided with the phosphor layer 7 can be easily singulated into individual pieces by expanding the expandable sheet 20 without using a cutting method such as dicing. In addition, the thickness of the phosphor layer 7 formed on the side surface of the light emitting element 1 depends on film thickness precision of the film formed by the spraying process, and does not depend on the singulating step. Therefore, the phosphor layer 7 having the high-precision film thickness can be formed by the spraying process.

Figure 6B:
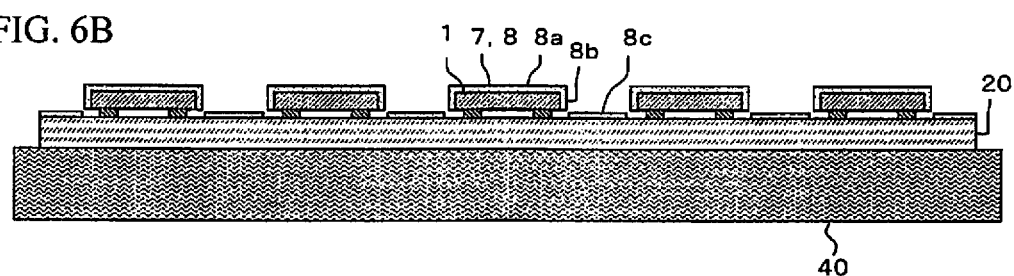

Subsequently, in the final curing step S17, as shown in FIG. 6B, the resin layer 8 is finally cured by the heating device 40. The heating device 40 may be the same as that used in the temporary curing step S15, but in order to complete the final curing process in a shorter time, a heating device having a heating ability higher than that used for the temporary curing process may be used.

In the case where the slurry which is prepared as described above is used, a main curing can be performed under the following condition, for example. Here, it is to be noted that the resin layer forming step S14 and the temporary curing step S15 are performed under the above-described condition (the three layers are stacked with the spray amount of about 0.7 mg/cm$^2$ for each layer, and then the heating process is performed for 5 minutes at 150° C.). In a case where the resin layer 8 is formed by laminating nine layers in total under the above condition, the heating process can be performed for four hours at 180° C. in an oven in the final curing process.

Figure 6C:
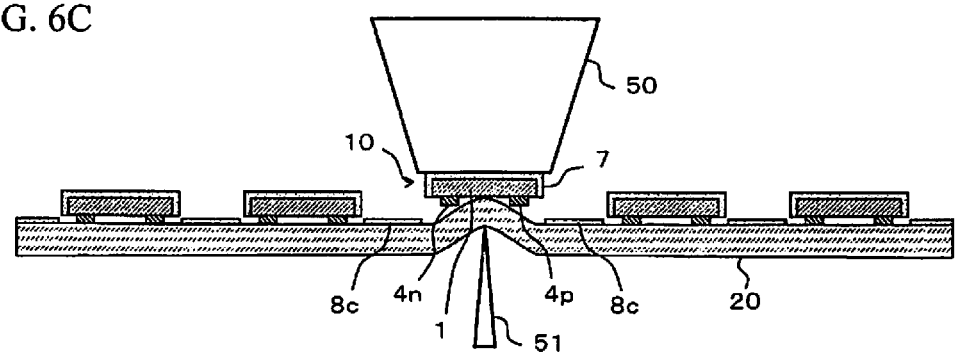

Subsequently, in the mounting step S18, the light emitting device 10 is picked up one by one with collet 50 and the pin 51 as shown in FIG. 6C, and set on the mounting region 94 of the mounting substrate 9 as shown in FIGS. 3A and 3B. More specifically, the collet 50 absorbs the phosphor layer 7 provided on the upper surface of the light emitting device 10, and the pin 51 pushes up the lower surface of the light emitting device 10 from the back surface side of the expandable sheet 20. In this way, the light emitting device 10 can be easily removed from the expandable sheet 20.

In the case where the expandable sheet 20 has the UV-curing resin layer as the adhesive agent to hold the light emitting device 10, the expandable sheet 20 is to be irradiated with UV light so that the adhesive agent is cured and its adhesiveness disappears before the light emitting device 10 is picked up with the collet 50 and the pin 51. Thus, the light emitting device 10 can be more easily removed from the expandable sheet 20.

After the light emitting devices 10 are set on all of the mounting regions 94, the solder layers as the negative electrode connection layer 93n and the positive electrode connection layer 93p are dissolved by heat in a reflow device. The n-side electrode 4n is electrically connected to the negative side wiring electrode 92n, and the p-side electrode 4p is electrically connected to the positive side wiring electrode 92p in each light emitting device 10, whereby the mounting of the light emitting devices 10 to the mounting substrate 9 is completed.

As described above, the solder bonding method by heat is preferably used to bond the electrode of the face-down mounting type light emitting device 10 to the electrode of the mounting substrate 9. Compared with the flip-chip mounting which is a bonding method using a pressure or ultrasonic vibration, a mechanical load is not applied to the phosphor layer 7 as the resin layer provided on the upper surface of the light emitting device 10, so that a damage such as a crack in the phosphor layer 7 can be prevented from occurring.

The light emitting devices 10 may be sealed with a sealing member such as a resin, or glass after the electrodes are bonded. Through the above steps, the light emitting device 100 with the mounting substrate is completed.

Next, a detailed description will be given to how the resin layer 8 formed on the surface of the light emitting element 1 is disunited from the sheet portion resin layer 8c when the expandable sheet 20 is expanded with reference to FIG. 8A to FIG. 8D.

Figure 8A:
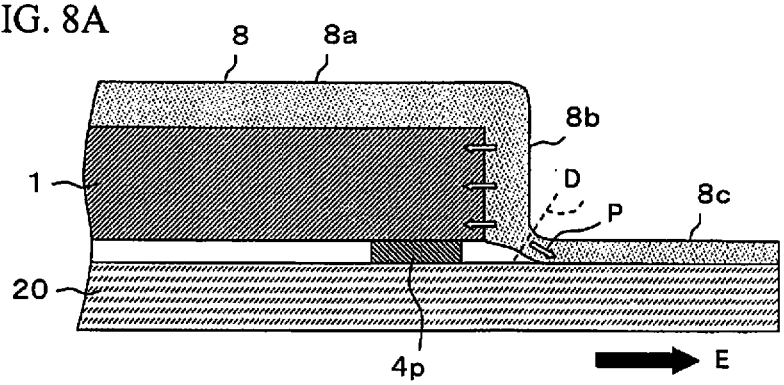
FIGS. 8A to 8D are schematic cross-sectional views each showing disuniting an unnecessary part of a resin layer containing phosphor particles i by expanding an expandable sheet, in a method of manufacturing a light emitting device according to an embodiment of the present invention, in which pre-curing and expanding of the expandable sheet are performed under a different condition.

An example shown in FIG. 8A shows a case where, in the temporary curing step S15, the temporary curing process of the resin layer 8 is performed naturally or in an extremely weak manner. The resin layer 8 in this case has such a condition that a viscosity is high to the extent that the side surface portion resin layer 8b does not drip, but its tensile strength is weak and the resin layer 8 is likely to be torn off. When the expandable sheet 20 is expanded in the sheet in-plane direction, that is, the lateral direction, the sheet portion resin layer 8c is elongated and thinned as the expandable sheet 20 is expanded. However, the side surface portion resin layer 8b is not disunited from the side surface of the light emitting element 1 due to adhesive force with the side face of the light emitting element 1, so that a connection portion of the side surface portion resin layer 8b to the sheet portion resin layer 8c is elongated. Thus, tensile force acts on the connection portion as shown by an arrow in the resin layer 8 in FIG. 8A. When the connection portion is elongated to a certain level or more, the resin layer 8 is cut along a disunion line shown by a broken line in FIG. 8A, that is, at a lower end portion of the side surface of the light emitting element 1. According to the example shown in FIG. 8A, the light emitting device 10 shown in FIG. 2A is provided in which the phosphor layer 7 is formed on the entire upper surface and the entire side surface.

In the case where the expandable sheet 20 is expanded in the lateral direction under the condition that the resin layer 8 is substantially not cured yet, the side surface portion resin layer 8b and the sheet portion resin layer 8c cannot be favorably disunited from each other, depending on the viscosity and the thickness of the resin layer 8 in some cases. Thus, the resin layer 8 may be disunited in such a manner that, after the expandable sheet 20 is expanded once at a predetermined expansion rate under the condition that the resin layer 8 is not cured yet, the temporary curing is performed, and then the expandable sheet 20 is expanded for a second time.

More specifically, by the first expansion of the expandable sheet 20, as shown in FIG. 8A, the sheet portion resin layer 8c is elongated and thinned. Then, the resin layer 8 is temporarily cured to increase the viscosity of the resin layer 8. At this time, the thickness is different between the side surface portion resin layer 8b and the sheet portion resin layer 8c, so that a stress is likely to concentrate on a boundary portion of the two layers. Then, by the second expansion of the expandable sheet 20 in the lateral direction, the resin layer 8 is torn off along the disunion line shown by the broken line in FIG. 8A, that is, at the lower end portion of the side surface of the light emitting element 1, so that the sheet portion resin layer 8c can be disunited and removed. In addition, the second expansion of the expandable sheet 20 may be in a vertical direction as shown in FIG. 8D, instead of the lateral direction. Even when the expandable sheet 20 is expanded in the vertical direction, the sheet portion resin layer 8c can be cut in the vicinity of the disunion line in FIG. 8A.

In addition, as for the resin layer 8 at the time of the second expansion of the expandable sheet 20, the resin layer 8 may have a state, for example, such that the inorganic material ratio is 60% by mass, the thickness of the sheet portion resin layer 8c is about 60 μm, the thickness of the side surface portion resin layer 8b is about 10 to 40 μm, and the solvent is almost evaporated. In this state, when the expandable sheet 20 is expanded, the resin layer 8 can be cut at the lower end of the side surface of the light emitting element 1. In addition, the hardness of the resin layer 8 after being cured completely (finally cured) is 60 to 80 as a value measured by the Type A Durometer. In addition, the thickness of the sheet portion resin layer 8c is preferably as thin as possible, and can be adjusted by the amount of expansion of the expandable sheet 20 at the first expansion and the viscosity of the slurry, in view of the thickness of the side surface portion resin layer 8b and the uniformity thereof.

According to this example, at the time of the spraying process, the resin layer 8 is formed without using a mask to adjust the amount of spray. According to this example, after the resin layer 8 is formed to have the uniform thickness by the spraying process, the sheet portion resin layer 8c is thinned by expanding the expandable sheet 20, to obtain the shape suitable for the cutting at the lower end of the side surface of the light emitting element 1. Furthermore, the ratio of the inorganic material is adjusted to facilitate the cutting caused by the expansion of the expandable sheet 20.

Thus, in order to disunite the resin layer 8 at a desired cutting position, the condition of the resin layer 8 after the temporary curing process can be adjusted in view of the ratio between the phosphor (and the inorganic filler) and the resin, the size and shape of the phosphor (and the inorganic filler), and characteristics of the resin such as hardness, adhesiveness, strength, and elongation. Furthermore, the shape and the thickness of the resin layer 8 can be controlled, and the thickness of the resin layer 8 can be thinned in the cutting position by appropriately adjusting the expansion rate of the expandable sheet 20, usage of the mask, the solvent amount in the slurry, and the drying temperature. As for the resin layers 8 shown in FIGS. 8A to 8D, it is assumed that, after the spraying process, the resin layer 8 is formed to have the uniform thickness from the upper surface of the light emitting element 1 to the upper surface of the expandable sheet 20.

Figure 8B:
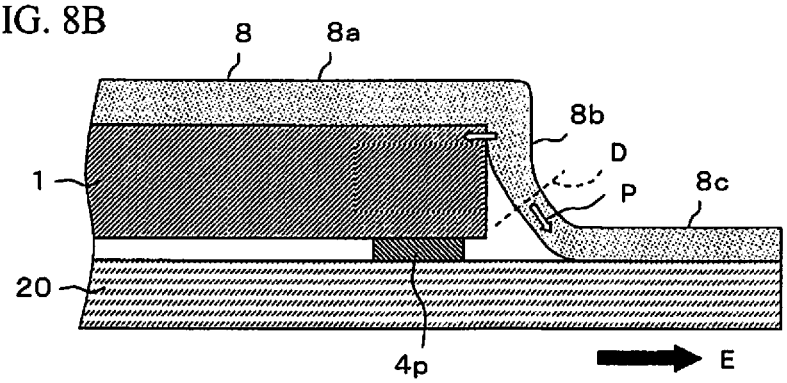

An example shown in FIG. 8B shows a case where, in the temporary curing step S15, the temporary curing process for the resin layer 8 is performed in a relatively weak manner. In this case, by the temporary curing process, the resin layer 8 has rigidity to some extent and a physical property in which it is elongated by tensile force. The side surface portion resin layer 8b has the rigidity to some extent, so that as the expandable sheet 20 is expanded in the sheet in-plane direction, that is, the lateral direction, tensile force from the sheet portion resin layer 8c acts on the side surface portion resin layer 8b in a direction shown by a right down arrow shown in the resin layer 8 in FIG. 8B. When a horizontal component of that tensile force exceeds the adhesive force to the side surface of the light emitting element 1, the side surface portion resin layer 8b is separated from the side surface of the light emitting element 1. When a connection portion between the side surface portion resin layer 8b and the sheet portion resin layer 8c is further elongated and reaches a certain level or more, the resin layer is cut along a separation line shown by a broken line in FIG. 8B, that is, halfway between the upper end and the lower end of the side surface of the light emitting element 1. Therefore, according to the example shown in FIG. 8B, the light emitting device 10A shown in FIG. 2B is manufactured in which the phosphor layer 7A is formed on the entire upper surface and one portion of the side surface.

According to the example shown in FIG. 8B, a volatile organic solvent is not sufficiently evaporated and remains in the resin layer 8, and the resin is poorly polymerized. That is, the temporary curing is insufficient in the resin layer 8. Therefore, the resin of the resin layer 8 in this state is fragile and poor in strength, so that the resin layer 8 is cut at the side surface portion of the light emitting element 1 when the expandable sheet 20 is expanded. In addition, this cutting position can be controlled by adjusting the conditions such as the thickness of the resin layer 8, the prescription of the slurry, and the temperature and time of the temporary curing process.

Figure 8C:
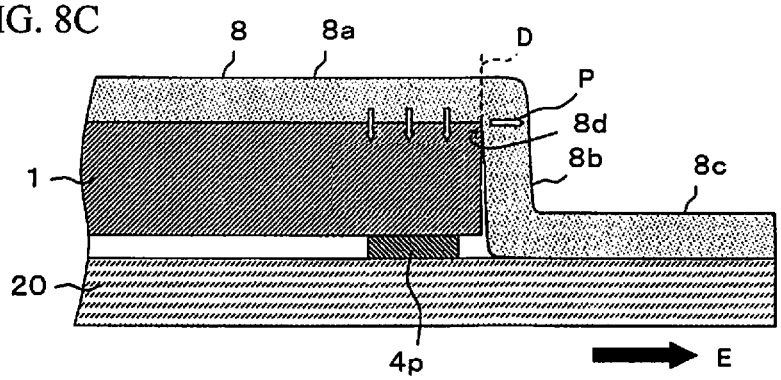
Figure 8D:
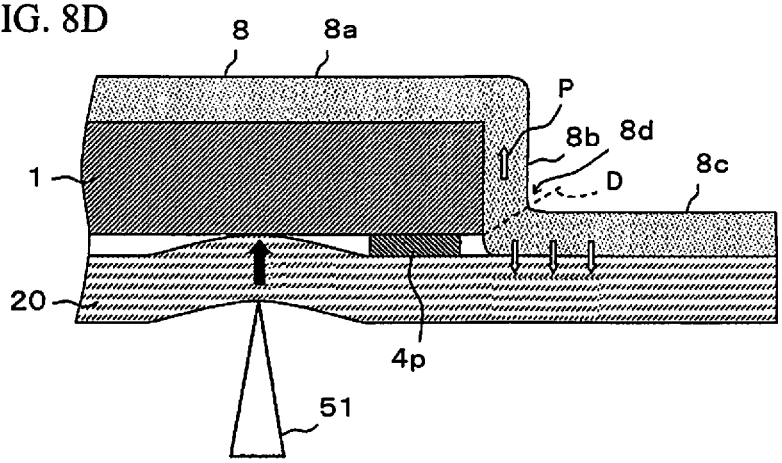

An example shown in FIG. 8C shows a case where, in the temporary curing step S15, the temporary curing process is performed for the resin layer 8 in a relatively strong manner. In this case, by the temporary curing process, the resin layer 8 has sufficient rigidity and a physical property in which it is hardly elongated even when tensile force acts thereon. The side surface portion resin layer 8b has the sufficient rigidity, so that as the expandable sheet 20 is expanded in the in-plane direction, that is, the lateral direction, tensile force from the sheet portion resin layer 8c acts on the side surface portion resin layer 8b. When the tensile force exceeds adhesive force with the side surface of the light emitting element 1, the side surface portion resin layer 8b is separated from the side surface of the light emitting element 1. In addition, the upper surface portion resin layer 8a is adhered to the upper surface of the light emitting element 1, so that the upper surface portion resin layer 8a is not separate even when the tensile force acts on a connection portion between the upper surface portion resin layer 8a and the side surface portion resin layer 8b. Therefore, when the tensile force acts on the connection portion at a certain level or more, a corner portion 8d of the resin layer 8 is cracked because a stress is most concentrated on the corner portion 8d, and the resin layer 8 is cut along a disunion line shown by a broken line in FIG. 8C, that is, at the upper end of the side surface of the light emitting element 1. Therefore, according to the example shown in FIG. 8C, the light emitting device 10B shown in FIG. 2C is manufactured in which the phosphor layer 7B is formed only on the entire upper surface.

According to the example shown in FIG. 8C, since the temporary curing is sufficiently performed for the resin layer 8, enough resin strength is provided. Therefore, when the force is applied in the horizontal direction (lateral direction) due to the expansion of the expandable sheet 20, the force is applied to separate the resin layer 8 from the light emitting element 1, and the resin layer 8 is cut at the upper portion of the light emitting element 1. At this point, it is thought that the resin contained in the resin layer 8 reaches a theoretical hardness.

An example shown in FIG. 8D shows a case where in the temporary curing step S15, the temporary curing process is performed for the resin layer 8, and in the resin layer disuniting step S16, the expandable sheet 20 is expanded in the vertical direction perpendicular to the sheet surface. The degree of temporary curing is not specifically limited, and the temporary curing process may be the same as the example shown in FIG. 8A (only natural curing) or the example shown in FIG. 8C (to the extent that elongation is hardly caused by the tensile force). In the following description, it is assumed that the temporary curing process is performed for the resin layer 8 in the same manner as the example shown in FIG. 8C, that is, in the relatively strong manner.

In this example, the term "the expandable sheet 20 is expanded in the vertical direction" means that the expandable sheet 20 is expanded from the back surface side of the expandable sheet 20 in the direction perpendicular to the sheet surface, with the pin 51, for example. As the expandable sheet 20 is expanded in the vertical direction, the light emitting element 1 is lifted upward, and the resin layer 8 formed on the surface of the light emitting element 1 is also lifted upward. Thus, upward tensile force acts on the side surface portion resin layer 8b. Meanwhile, the sheet portion resin layer 8c is strongly adhered to the surface of the expandable sheet 20, so that the sheet portion resin layer 8c is not disunited from the expandable sheet 20 even when the tensile force in the lateral direction acts on the sheet portion resin layer 8c. Therefore, a corner portion 8d is cracked because the stress is most concentrated in a connection portion between the side surface portion resin layer 8b and the sheet portion resin layer 8c, and the resin layer 8 is cut along a disunion line shown by a broken line in FIG. 8D, that is, at the lower end of the side surface of the light emitting element 1. According to the example shown in FIG. 8D, the light emitting device 10 shown in FIG. 2A is manufactured in which the phosphor layer 7 is formed on the entire upper surface and the entire side surface.

In the example shown in FIG. 8D, since the force is applied in the vertical direction, unlike the example shown in FIG. 8C, there is no force acting to disunite the resin formed on the side surface of the light emitting element 1. Even when the resin is increased in strength by sufficiently performing the temporary curing process, the cutting position is the lower portion of the side surface of the light emitting element 1.

In the case where the resin layer 8 is temporarily cured in the relatively weak manner, or in the case the resin layer 8 is only cured naturally, when the expandable sheet 20 is expanded in the vertical direction, tensile force acts on the side surface portion resin layer 8b in the vertical direction. When the connection portion between the side surface portion resin layer 8b and the sheet portion resin layer 8c is elongated by this tensile force to a certain level or more, the resin layer 8 is cut somewhere in the connection portion depending on the tensile strength of the connection portion. Therefore, when the expandable sheet 20 is expanded in the vertical direction, the resin layer 8 is cut at the lower end of the side surface of the light emitting element 1 regardless of the degree of the temporary curing process.

In the example shown in FIG. 8A or FIG. 8B, after the expandable sheet 20 is expanded in the lateral direction, the expandable sheet 20 may be further expanded in the vertical direction similar to the example shown in FIG. 8D. Even when the resin layer 8 cannot be completely cut by the expansion of the expandable sheet 20 in the lateral direction, the resin layer 8 can be completely cut when the expandable sheet 20 is further expanded in the vertical direction.

Like the examples shown in FIGS. 8C and 8D, when the resin layer 8 is temporarily cured to the extent that it is not elongated by the tensile force, the cut position of the resin layer 8 can be specified to the position in which the stress is most concentrated. Therefore, the shape of the phosphor layer 7 finally formed on the surface of the light emitting element 1 can be stabilized.

Thus, by controlling the degree of the temporary curing process of the resin layer 8 and the expansion direction of the expandable sheet 20 in the temporary curing step S15, the cut position of the resin layer 8 in the resin layer disuniting step S16 can be adjusted within the range from the upper end to the lower end of the side surface of the light emitting element 1.

In the case where the expandable sheet 20 is expanded in the vertical direction in the resin layer disuniting step S16, it is possible to simultaneously perform the resin layer disuniting step S16 and the step of picking up the light emitting device 10 as a sub-step of the mounting step S18. That is, as shown in FIG. 6C, the light emitting device 10 is picked up with the collet 50 in the pick-up step, and the expandable sheet 20 is lifted up with the pin 51 from the back surface side and then the expandable sheet 20 is expanded in the vertical direction in the resin layer disuniting step S16.

Next, a description will be given to another method to control the cutting position of the resin layer 8. As a first method, at the time of spraying the slurry, the amount of the solvent is relatively reduced so that the slurry can be dried quickly, whereby the thickness of the resin layer 8 formed at the lower portion of the side surface of the light emitting element 1 can be intentionally made thin. Thus, the resin layer 8 can be thin and cut at the lower portion of the side surface of the light emitting element 1.

As a second method, in a case where the resin layer 8 is to be thickly formed at the lower portion of the side surface of the light emitting element 1, the amount of the solvent is increased so that the slurry is not dried quickly, whereby the phosphor particles can be settled down microscopically. As a result, the thick resin layer 8 can be formed at the lower portion of the side surface of the light emitting element 1, and the resin layer 8 has a high content ratio of the phosphor particles at the lower portion of the side surface of the light emitting element 1. Thus, when the expandable sheet 20 is expanded, the crack can be generated at the lower portion of the side surface of the light emitting element 1 as a cutting start point, so that the cutting position can be provided at the lower portion of the side surface.

As a third method, at the time of spraying the slurry, the mask is used to block an upper surface of the expandable sheet 20 in the vicinity of the boundary between the light emitting element 1 and the expandable sheet 20, so that a thickness of the resin layer 8 can be made thinner on the expandable sheet 20 in the vicinity of the boundary with the light emitting element 1 than that formed on the upper surface and the side surface of the light emitting element 1. When the resin layer 8 is formed into that shape, the resin layer 8 can be cut at the lower end of the side surface of the light emitting element 1 when the expandable sheet 20 is expanded.

A description will be given to a method of manufacturing the light emitting device including the reflective resin layer 11 in the side surface and the lower surface of the light emitting element 1 except for the region covered with the phosphor layer 7, such as the light emitting devices 10C, 10D, 10E, and 10F shown in FIGS. 2D to 2G, respectively.

(Method 1)

First, a description will be given to the case where the reflective resin layer 11 is provided on the lower surface of the light emitting element 1 like the light emitting device 10C shown in FIG. 2D. In this case, in the light emitting element arranging step S13, before the light emitting elements 1 are arranged on the expandable sheet 20, a pattern of the reflective resin layer 11 is previously formed on a region corresponding to the lower surface of the light emitting element 1 to be arranged. After that, when the light emitting element 1 is set, each pattern of the reflective resin layer 11 is bonded to the lower surface region of the corresponding light emitting element 1. After that, the resin layer forming step S14 and the subsequent steps are performed, whereby the light emitting device 10C can be formed.

(Method 2)

Like the light emitting device 10D shown in FIG. 2E or the light emitting device 10F shown in FIG. 2G, in the case where the reflective resin layer 11 is provided on the lower surface and the side surface of the light emitting element 1, the reflective resin layer 11 can be formed as follows. After the resin layer 8 is disunited due to the expansion of the expandable sheet 20, the reflective resin layer 11 is formed in such a manner that relatively high-viscosity slurry containing a filler of a light reflection member and a thermosetting resin is applied as the raw material of the reflective resin layer 11 onto the lower surface and the side surface of the light emitting element 1 with a pneumatic dispenser, for example, and the resin is cured by heat. The light emitting device 10C can be also formed similarly in such a manner that the slurry serving as the raw material of the reflective resin layer 11 is applied to the lower surface portion of the light emitting element 1, and then the resin is cured.

(Method 3)

The light emitting device 10C or 10D, or the light emitting device 10E shown in FIG. 2F can be also formed as follows. Before the resin layer 8 as the phosphor layer 7 is formed, high-viscosity slurry containing a filler of the light reflection member and a thermosetting resin is applied to a desired region of the lower surface or the lower surface and the side surface of the light emitting element 1 with the above pneumatic dispenser. Here, the viscosity of the slurry as the raw material of the reflective resin layer 11 is preferably higher than that of the slurry as the raw material of the resin layer 8.

Under the condition that the reflective resin layer 11 is not yet cured, the resin layer 8 is sprayed as described above. Then, the reflective resin layer 11 and the resin layer 8 are heated and temporarily cured. At this time, since the reflective resin layer 11 and the resin layer 8 are contacted each other under the condition that the reflective resin layer 11 and the resin layer 8 are not yet cured, and then temporarily cured. Thus, the reflective resin layer 11 and the resin layer 8 can be strongly bonded with high adhesiveness. Since the slurry as the raw material of the reflective resin layer 11 has the higher viscosity, the reflective resin layer 11 is prevented from being excessively mixed with the resin layer 8 which is applied in a later operation, and the phosphor layer 7 can be formed in the desired region with high precision. After the reflective resin layer 11 and the resin layer 8 are formed, the reflective resin layer 11 can be disunited at the lower end portion of the light emitting element 1 by the expanding of the expandable sheet 20.

In addition, in order to easily disunite the reflective resin layer 11 due to the expansion of the expandable sheet 20, the content of the above filler of the light reflection member contained in the reflective resin layer 11 (defined similarly to the above inorganic material ratio) is preferably 40 to 80% by mass. Thus, similar to the above disunion of the resin layer 8, the reflective resin layer 11 can be easily torn off at the outer edge part of the light emitting element 1 when the expandable sheet 20 is expanded.

The resin used in the reflective resin layer 11 preferably has low adhesiveness relative to the expandable sheet 20, and lower adhesiveness relative to the expandable sheet 20 than the adhesiveness relative to the light emitting element 1, in order that the reflective resin layer 11 provided on the lower surface of the light emitting element 1 can be easily disunited from the expandable sheet 20 at the time of picking up the light emitting device 10C or the like in the mounting step S18. The same is true for the resin used in the reflective resin layer 11, in Method 1 and Method 2.

A groove may be formed by irradiating the disunion line of the temporary cured reflective resin layer 11 with short-pulse laser light having a relatively low output before the expandable sheet 20 is expanded. Thus, when the expandable sheet 20 is expanded, the reflective resin layer 11 can be disunited along the desired disunion line with higher precision. The technique of forming the groove along the disunion line by the irradiation of the laser light may be used when the resin layer 8 is disunited in the resin layer disuniting step S16.

As described above, according to the method of forming the phosphor layer in the present invention, there is no need to form a specific layer such as a conductive layer, so that the method is high in degree of freedom, compared with the method of forming the phosphor layer 7 using the electrode position method disclosed in JP 2003-69086 A. In addition, according to the method of forming the phosphor layer 7 in the present invention by the spraying process and the expandable sheet 20, the phosphor layer having the uniform thickness can be easily formed on the entire exposed surface of the light emitting element 1 whatever structure the light emitting element has.

In the above, the light emitting device and the method of manufacturing the light emitting device according to the present invention have been described in the embodiments of the present invention, but the scope of the present invention is not limited to the above description, and it is to be widely interpreted based on the description of claims. In addition, various modifications and variations made based on the above description are also included in the scope of the present invention, as a matter of course.

What is claimed is:
1. A light emitting device comprising:
at least one semiconductor light emitting element;
a pair of electrodes projecting from a lower surface of the semiconductor light emitting element;
a protective layer covering a part of a side surface of the semiconductor light emitting element and a part of a side surface of each of the electrodes; and
a wavelength conversion layer including a resin layer containing a wavelength conversion member for converting a wavelength of light emitted from the semiconductor light emitting element, the wavelength conversion layer covering the protective layer, a part of the side surface of the semiconductor light emitting element that is not covered by the protective layer, and an upper surface of the semiconductor light emitting element without the wavelength conversion layer contacting the electrodes, wherein
a content of an inorganic material including the wavelength conversion member, or a content of an inorganic material including the wavelength conversion member and an inorganic filler, in the resin layer is 30% by mass or more and 99% by mass or less.
2. The light emitting device according to claim 1, wherein
a thickest portion of the resin layer is equal to or less than 500 μm in thickness, a lower end portion of the wavelength conversion layer is equal to or less than 200 μm in thickness, and the lower end portion has a thickness less than the thickness of the thickest portion, and
a thickness of a portion of the wavelength conversion layer covering the upper surface of the semiconductor light emitting element is greater than a thickness of a portion of the wavelength conversion layer covering the side surface of the semiconductor light emitting element.
3. The light emitting device according claim 1, wherein the wavelength conversion layer has a structure having a plurality of stacked layers each having a different ratio of the inorganic material.
4. The light emitting device according to claim 3, wherein the ratio of the inorganic material of at least one of the plurality of the stacked layers in the wavelength conversion layer is equal to or more than 50% by mass.
5. The light emitting device according to claim 1, wherein the wavelength conversion member has an average grain diameter of 1 μm to 50 μm.
6. The light emitting device according to claim 3, wherein the plurality of stacked layers include a plurality of inorganic material rich layers each having a high inorganic material ratio and a plurality of clear layers having a low inorganic material ratio alternately stacked on each other.
7. The light emitting device according to claim 1, wherein the resin layer is made of thermosetting resin.
8. The light emitting device according to claim 1, wherein the content of the inorganic material including the wavelength conversion member, or the content of the inorganic material including the wavelength conversion member and the inorganic filler, in the resin layer is 50% by mass or more and 90% by mass or less.
9. The light emitting device according to claim 1, wherein the content of the inorganic material including the wavelength conversion member, or the content of the inorganic material including the wavelength conversion member and the inorganic filler, in the resin layer is 60% by mass or more and 85% by mass or less.

10. The light emitting device according to claim 1, wherein
the light emitting device is mounted on a mounting substrate.

11. The light emitting device according to claim 10, wherein
a region in an upper surface of the mounting substrate except for a mounting region for the light emitting device is covered with an insulating reflection layer.

12. The light emitting device according to claim 10, further comprising
a light-transmissive sealing member sealing the light emitting device.

13. The light emitting device according claim 2, wherein
the wavelength conversion layer has a structure having a plurality of stacked layers each having a different ratio of the inorganic material.

14. The light emitting device according to claim 13, wherein
the ratio of the inorganic material of at least one of the plurality of the stacked layers in the wavelength conversion layer is equal to or more than 50% by mass.

15. The light emitting device according to claim 14, wherein
the wavelength conversion member has an average grain diameter of 1 μm to 50 μm.

16. The light emitting device according to claim 15, wherein
the plurality of stacked layers include a plurality of inorganic material rich layers each having a high inorganic material ratio and a plurality of clear layers having a low inorganic material ratio alternately stacked on each other.

17. The light emitting device according to claim 16, wherein
the resin layer is made of thermosetting resin.

18. The light emitting device according to claim 17, wherein
the content of the inorganic material including the wavelength conversion member, or the content of the inorganic material including the wavelength conversion member and the inorganic filler, in the resin layer is 50% by mass or more and 90% by mass or less.

19. The light emitting device according to claim 18, wherein
the content of the inorganic material including the wavelength conversion member, or the content of the inorganic material including the wavelength conversion member and the inorganic filler, in the resin layer is 60% by mass or more and 85% by mass or less.

20. The light emitting device according to claim 2, wherein
the light emitting device is mounted on a mounting substrate.

21. The light emitting device according to claim 20, wherein
a region in an upper surface of the mounting substrate except for a mounting region for the light emitting device is covered with an insulating reflection layer.

22. The light emitting device according to claim 21, further comprising
a light-transmissive sealing member sealing the light emitting device.

23. The light emitting device according to claim 1, wherein
the semiconductor light emitting element includes a substrate and a semiconductor stacked layer, and
the protective layer covers the part of the side surface of the semiconductor light emitting element corresponding to the semiconductor stacked layer.

24. The light emitting device according to claim 1, wherein
the semiconductor light emitting element includes a substrate and a semiconductor stacked layer, and
a side surface of the protective layer is substantially flush with a part of the side surface of the semiconductor light emitting element corresponding to the substrate.

* * * * *